(12) United States Patent
Uzoh et al.

(10) Patent No.: US 9,865,548 B2
(45) Date of Patent: Jan. 9, 2018

(54) POLYMER MEMBER BASED INTERCONNECT

(71) Applicant: Invensas Corporation, San Jose, CA (US)

(72) Inventors: Cyprian Emeka Uzoh, San Jose, CA (US); Rajesh Katkar, San Jose, CA (US); Charles G. Woychik, San Jose, CA (US); Guilian Gao, San Jose, CA (US); Arkalgud R. Sitaram, Cupertino, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/158,963

(22) Filed: May 19, 2016

(65) Prior Publication Data

US 2016/0268205 A1    Sep. 15, 2016

Related U.S. Application Data

(62) Division of application No. 14/489,358, filed on Sep. 17, 2014, now Pat. No. 9,373,585.

(51) Int. Cl.
| | |
|---|---|
| *H01L 21/00* | (2006.01) |
| *H01L 23/49* | (2006.01) |
| *H01L 21/76* | (2006.01) |
| *H01L 23/532* | (2006.01) |
| *H01L 23/522* | (2006.01) |
| *H01L 23/00* | (2006.01) |

(Continued)

(52) U.S. Cl.
CPC ...... *H01L 23/5328* (2013.01); *H01L 21/7684* (2013.01); *H01L 21/76838* (2013.01); *H01L 21/76898* (2013.01); *H01L 23/49811* (2013.01); *H01L 23/5226* (2013.01); *H01L 24/83* (2013.01); *H01L 25/0652* (2013.01); *H01L 2224/0401* (2013.01); *H01L 2224/131* (2013.01); *H01L 2224/16148* (2013.01); *H01L 2224/16227* (2013.01); *H01L 2224/4823* (2013.01); *H01L 2224/73203* (2013.01); *H01L 2224/73257* (2013.01); *H01L 2224/81191* (2013.01); *H01L 2224/81192* (2013.01)

(58) Field of Classification Search
CPC ......... H01L 23/53; H01L 21/76; H01L 23/49; H01L 21/00
USPC ........ 257/691, 288, 678, 685, 686, E23.002, 257/E23.011, E23.024, E23.025; 438/48, 438/117–125, 107–109
See application file for complete search history.

(56) References Cited

U.S. PATENT DOCUMENTS

| | | |
|---|---|---|
| 6,322,903 B1 | 11/2001 | Siniaguine et al. |
| 6,338,984 B2 | 1/2002 | Minamio et al. |

(Continued)

OTHER PUBLICATIONS

U.S. Appl. No. 14/214,365 titled, "Integrated Circuits Protected By Substrates With Cavities, And Methods of Manufacture," filed Mar. 14, 2014, 40 pages.

(Continued)

*Primary Examiner* — Sheikh Maruf
(74) *Attorney, Agent, or Firm* — Haynes and Boone, LLP.

(57) ABSTRACT

An interconnect (124) suitable for attachment of integrated circuit assemblies to each other comprises a polymer member (130) which is conductive and/or is coated with a conductive material (144). Such interconnects replace metal bond wires in some embodiments. Other features are also provided.

19 Claims, 42 Drawing Sheets

(51) Int. Cl.
  *H01L 21/768* (2006.01)
  *H01L 23/498* (2006.01)
  *H01L 25/065* (2006.01)

(56) References Cited

U.S. PATENT DOCUMENTS

| | | | |
|---|---|---|---|
| 7,215,019 B1* | 5/2007 | Lin | H01L 21/4832 257/691 |
| 8,097,490 B1* | 1/2012 | Pagaila | H01L 21/561 257/E21.007 |
| 8,618,659 B2 | 12/2013 | Sato et al. | |
| 2005/0109455 A1 | 5/2005 | Bai | |
| 2007/0035033 A1 | 2/2007 | Ozguz et al. | |
| 2008/0054444 A1* | 3/2008 | Tuttle | H01L 21/76898 257/698 |
| 2008/0136035 A1 | 6/2008 | Aggarwal | |
| 2008/0169546 A1* | 7/2008 | Kwon | H01L 21/561 257/686 |
| 2008/0315385 A1* | 12/2008 | Gerber | H01L 21/561 257/686 |
| 2008/0316714 A1 | 12/2008 | Eichelberger | |
| 2009/0014859 A1* | 1/2009 | Jeung | H01L 21/4853 257/686 |
| 2009/0166862 A1 | 7/2009 | Kweon et al. | |
| 2009/0200663 A1 | 8/2009 | Daubenspeck et al. | |
| 2009/0283898 A1* | 11/2009 | Janzen | H01L 21/76898 257/698 |
| 2010/0144101 A1 | 6/2010 | Chow | |
| 2010/0148360 A1* | 6/2010 | Lin | H01L 21/6835 257/737 |
| 2010/0171205 A1* | 7/2010 | Chen | H01L 21/565 257/686 |
| 2010/0171207 A1* | 7/2010 | Shen | H01L 21/4853 257/686 |
| 2010/0232129 A1 | 9/2010 | Haba et al. | |
| 2010/0237495 A1* | 9/2010 | Pagaila | H01L 21/568 257/700 |
| 2011/0068468 A1* | 3/2011 | Lin | H01L 23/49816 257/737 |
| 2011/0156264 A1 | 6/2011 | Machida | |
| 2012/0056316 A1 | 3/2012 | Pagaila | |
| 2012/0073859 A1 | 3/2012 | Lo et al. | |
| 2012/0228778 A1 | 9/2012 | Kosenko et al. | |
| 2012/0267777 A1 | 10/2012 | Haba et al. | |
| 2013/0014978 A1 | 1/2013 | Uzoh et al. | |
| 2013/0046368 A1 | 2/2013 | Storey | |
| 2013/0113116 A1 | 5/2013 | Chen | |
| 2013/0249076 A1* | 9/2013 | Lee | H01L 23/498 257/737 |
| 2013/0313716 A1 | 11/2013 | Mohammed | |
| 2014/0036454 A1 | 2/2014 | Caskey et al. | |
| 2014/0070415 A1* | 3/2014 | Vincent | H01L 24/19 257/741 |
| 2014/0103527 A1* | 4/2014 | Marimuthu | H01L 23/3121 257/737 |
| 2014/0110840 A1* | 4/2014 | Wojnowski | H01L 23/49822 257/738 |
| 2014/0203443 A1 | 7/2014 | Pagailia et al. | |
| 2014/0252646 A1 | 9/2014 | Hung | |
| 2014/0353839 A1* | 12/2014 | Lin | H01L 23/481 257/774 |
| 2015/0364344 A1* | 12/2015 | Yu | H01L 21/56 257/713 |

OTHER PUBLICATIONS

U.S. Appl. No. 61/952,066 titled, "Integrated Circuits Protected by Substrates with Cavities, and Methods of Manufacture," filed Mar. 12, 2014, 35 pages.

International Search Report and Written Opinion dated Dec. 15, 2015, received in PCT Application PCT/US2015/050395.

* cited by examiner

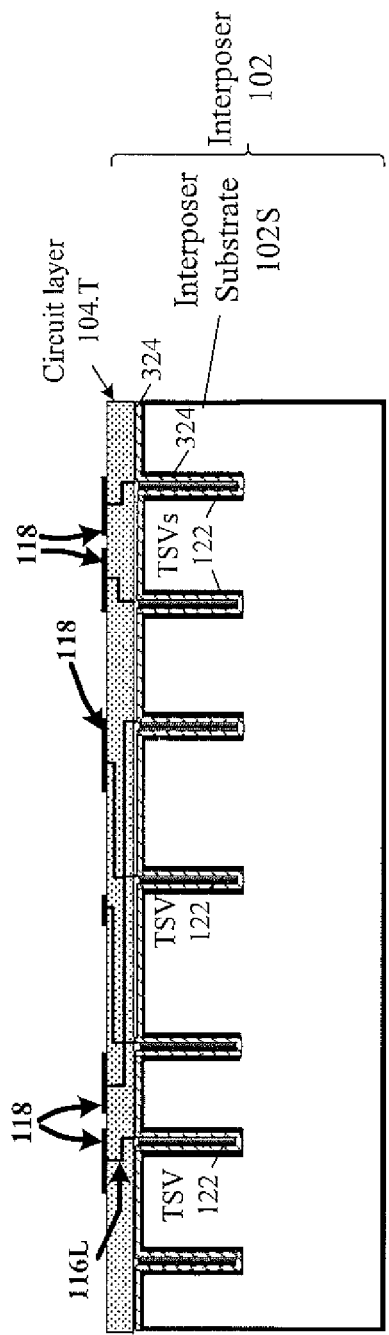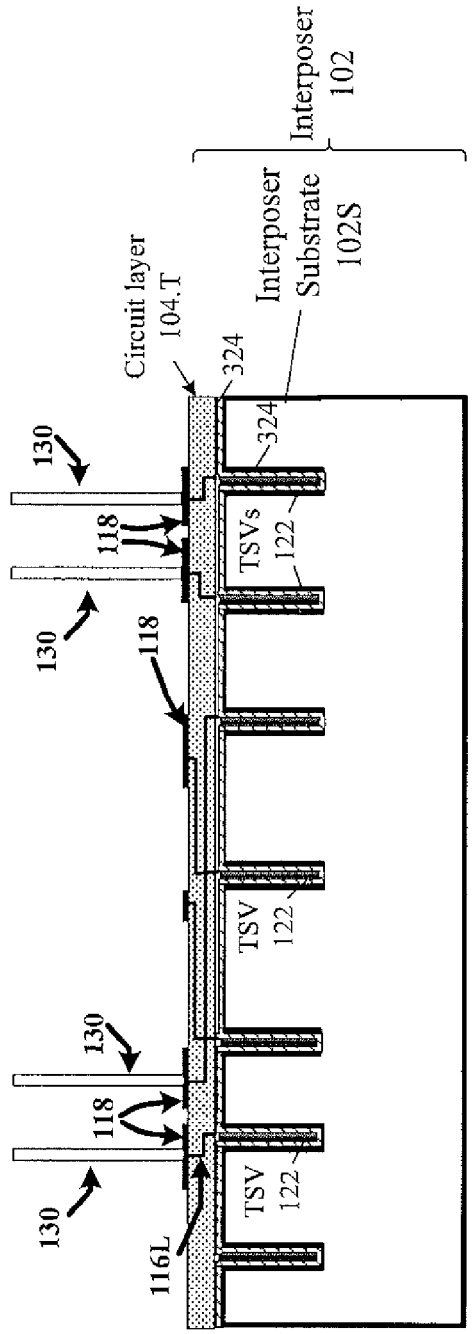
FIG. 6A
FIG. 6B

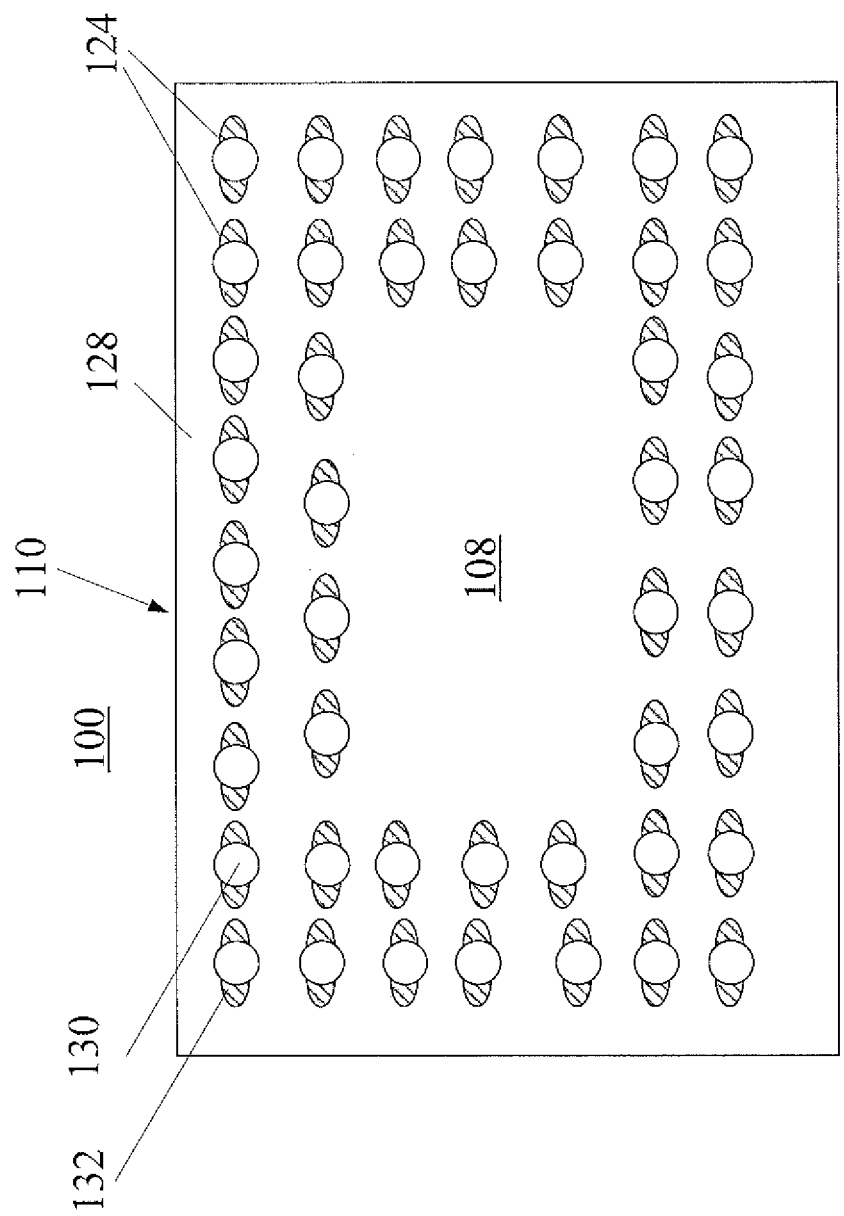

POLYMER MEMBER BASED INTERCONNECT

CROSS-REFERENCE TO RELATED APPLICATIONS

The present application is a division of U.S. patent application Ser. No. 14/489,358, filed Sep. 17, 2014, incorporated herein by reference.

BACKGROUND

The present disclosure describes interconnect structures. Exemplary embodiments include interconnect structures that can be used for integrated circuits and their assemblies.

An integrated circuit (IC) is a small device with tiny contact pads that must be connected to other circuitry to form a complete system. The interconnection between different ICs or IC assemblies can be done through an interconnect substrate, i.e. a substrate with interconnect lines, e.g. a printed circuit board (PCB) or an interposer. Sometimes, the ICs' contact pads are connected to the substrate's contact pads by metal bond wires: one end of the metal wire is attached to the top surface of the IC, and the other end to the top surface of the substrate (e.g., by melting the end of the metal wire or by ultrasonic bonding). However, to reduce the size of the assembly and shorten the electrical paths, the metal wires can be eliminated: the ICs can be connected to the substrate by flip-chip techniques, i.e., the IC's contact pads can be attached to the substrate's contact pads by solder, adhesive (conductive or anisotropic), or diffusion bonding without the intermediacy of the metal wires.

Sometimes the ICs are stacked on top of each other, and the contact pads of different ICs can be connected together by solder, adhesive, or diffusion bonding as in flip-chip attachment. Such a stack can then be connected to an interconnect substrate. Multiple stacks or IC assemblies can be connected to the substrate to form larger assemblies, which in turn can be connected to other assemblies by similar techniques, possibly using additional substrates.

A challenging situation arises if an assembly includes a stack of ICs or substrates of different lateral sizes; see FIG. 1A, showing three ICs 112.1, 112.2, 112.3 called "die". (ICs can be manufactured in batch in a semiconductor wafer, which is then cut up to separate the ICs from the wafer; each such IC is called a die or a chip.) The three die are stacked on a substrate 102, and the adjacent die are flip-chip attached to each other, but the top die (112.3) is connected to the substrate by a metal bond wire 114 attached to the top surface of the die and the substrate. In order to shorten this connection, the wire could be replaced by a conductive path passing through the die 112.1 and 112.2 (using through substrate vias (TSVs) for example). However, a simpler solution, eliminating the TSV complexities, is as shown in FIG. 1B, i.e. connect the metal wire 114 to the bottom of die 112.3. This can be done by a process of FIGS. 2A and 2B: first attach the metal wires 114 and die 112.1 and 112.2 (but not 112.3) to substrate 102 as in FIG. 2A, encapsulate the metal wires and the die 112.1 and 112.2 by a molding compound (e.g. epoxy) 128 to stabilize the metal wires 114, and then place the die 112.3 on die 112.2 and the epoxy and bond the die 112.3 to the metal wires 114 as in FIG. 2B. See e.g., FIG. 6 of U.S. Pat. No. 8,618,659 to Sato et al., which patent is incorporated herein by reference herein in its entirety and FIG. 1 of U.S. Pre-Grant Patent Publication No. 2014/0036454 to Caskey et al., which publication is incorporated herein by reference in its entirety.

Bonding the metal wires 114 to the substrate 102 (as in FIG. 1A or 1B) is a lengthy process because the metal wires are attached to the substrate one at a time, as described in U.S. Pre-Grant Patent Publication No. 2013/0313716 to Mohammed, which is incorporated by reference in its entirety. This is especially burdensome for large numbers of metal wires (e.g. hundreds or thousands.)

It is desirable to provide improved processes and materials for forming interconnections.

SUMMARY

This section summarizes some features of the exemplary implementations of the invention. Other features are described below. The invention is not limited to the features described in this section.

In various embodiments, the metal wires such as 114 are replaced by metal-coated polymer, or by polymer coated with a non-metal conductive layer. In some embodiments, the polymer members (polymer cores) of all wires can be made simultaneously, for example, by stamping or by deposition and etch. Then the conductive coating can be formed simultaneously on all polymer cores, e.g. by electrodeposition and/or electroless deposition and/or sputtering and/or chemical vapor deposition (CVD) and/or printing and/or any other suitable technique. In some embodiments, this is faster and cheaper than bonding metal wires to the substrate one at a time, especially for large numbers of wires. Also, some polymers are cheaper than metal. However, the invention is not limited to any numbers of wires, and includes embodiments with just one polymer-based wire. Further, the invention includes embodiments with multiple polymer-based wires attached to the substrate one at a time.

In some embodiments, the polymer is conductive, and a conductive coating may or may not be present. Other features and advantages are within the scope of the invention, as described below.

BRIEF DESCRIPTION OF THE DRAWINGS

FIGS. 6A-6J are vertical cross-sectional views of a microelectronic assembly that includes a substrate with polymer wires at different stages of fabrication according to some embodiments of the present disclosure.

FIGS. 16A-16B are plan views of a microelectronic assembly with polymer wires having a discontinuous conductive coating according to some embodiments of the present disclosure.

DETAILED DESCRIPTION

This section illustrates some embodiments of the invention.

Figure 1A:
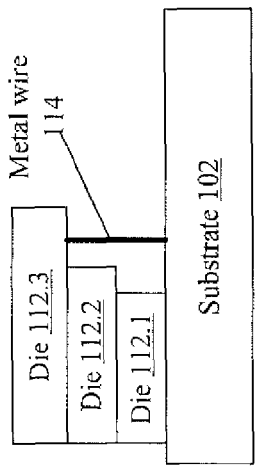
FIGS. 1A-1B and FIGS. 2A-2B are prior art assemblies that include a stack of integrated circuits of different lateral sizes.
Figure 1B:
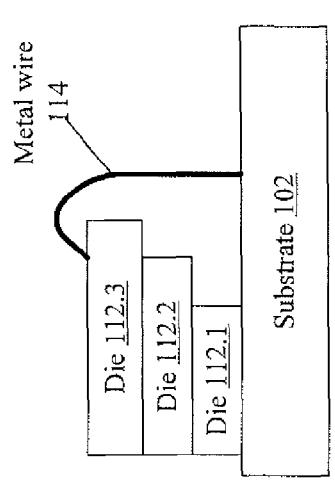
Figure 2A:
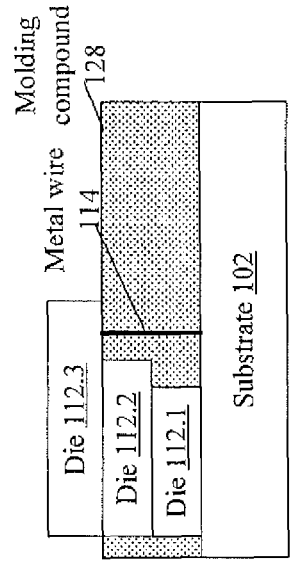
Figure 2B:
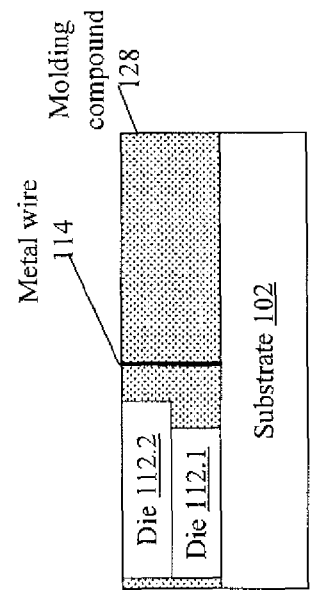
Figure 3:
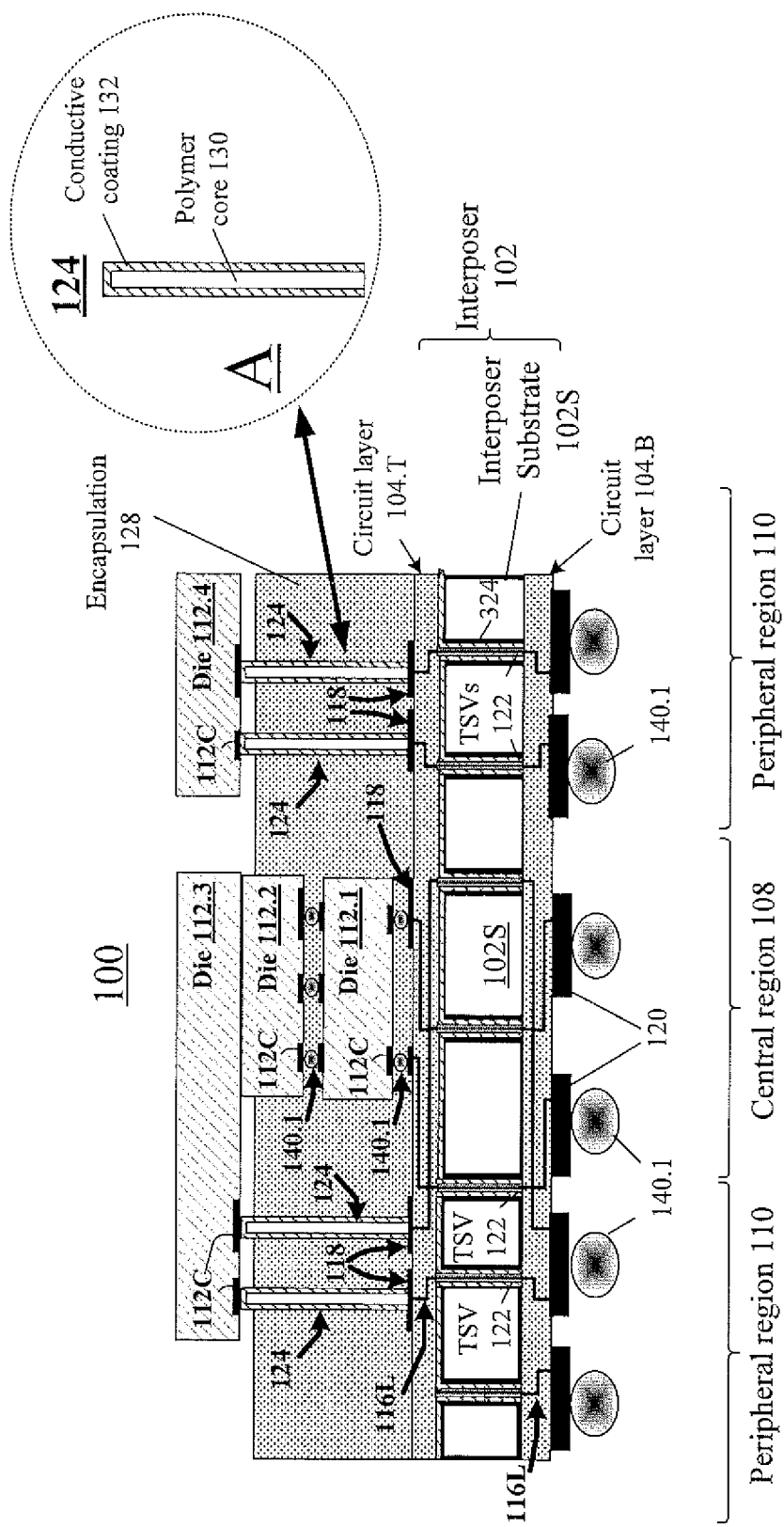
FIG. 3 is a vertical cross-sectional view of a microelectronic assembly that includes a substrate with polymer wires according to some embodiments of the present disclosure.

Turning to the figures, where similar numeric references are used to indicate similar features, there is shown in FIG. 3 a microelectronic assembly 100 according to an embodiment of the present disclosure. The embodiment of FIG. 3 shows four microelectronic components 112 (112.1 through 112.4) which can be ICs, e.g., semiconductor chips or assemblies with chips and interposers, for use in computer or other applications; any number of ICs and assemblies can be present.

Substrate 102 can be a printed circuit board or some other kind of substrate, and in the embodiment of FIG. 3, substrate 102 is an interposer having contact pads 118 on top and contact pads 120 on the bottom for connection to ICs or other interposers or PCBs or possibly other components. Interposer 102 has a body 102S made of a suitable material, e.g., dielectric or conductive or semiconductor, including possibly silicon, glass, metal, etc. An exemplary dielectric substrate 102S includes one or more layers of organic dielectric materials or composite dielectric materials, such as, without limitation: polyimide, polytetrafluoroethylene ("PTFE"), epoxy, epoxy-glass, FR-4, BT resin, thermoplastic, or thermoset plastic materials. We will use the same term, "substrate", for interposer 102 and body 102S.

For ease of illustration, substrate 102S is substantially flat, e.g., sheet-like, and may be thin, e.g. 1 to 500 μm in some embodiments, but other shapes and thickness figures are possible. Substrate 102S is shown as horizontal for ease of description, but can be at any angle or thickness, does not have to be flat, and may have other geometry including, for example, varying thickness, cavities, and other features.

In the embodiment shown, interposer 102 includes a circuit layer 104.T on top of substrate 102S and another circuit layer 104.B on the bottom of substrate 102S. Substrate 102S together with circuit layers 104 (i.e., 104.T and 104.B) may include circuitry 116 including interconnects, resistors, capacitors, transistors, or other circuit elements. Contact pads 118 and 120 are part of circuitry 116.

In the embodiment shown, circuitry 116 includes conductive vias 122 (Through-Substrate Vias, or TSVs) which pass through substrate 102S to interconnect various circuit elements. If the substrate 102S is not dielectric, TSVs 122 can be electrically insulated from substrate 102S by a dielectric layer 324. In the embodiment shown, dielectric 324 also covers the top surface of substrate 102S, but these features are optional.

Circuit layers 104 each include conductive lines 116L provided by circuitry 116 which connect the TSVs 122 to contact pads 118 and 120. Lines 116L may also interconnect selected contact pads 118 in a desired pattern, and may interconnect selected contact pads 120 in a desired pattern. One or more (possibly all) of elements 116L, 118, 120 can be formed from metal materials such as copper, gold, nickel, or their alloys, or from doped polysilicon, or other types of conductors. These details are not limiting: one or both of layers 104 can be omitted, and some embodiments have no circuitry or contact pads on the bottom.

In the exemplary embodiment being described, substrate 102S has a central region 108 with top contact pads 118 attached to contact pads 112C of die 112.1 by connections 140.1 (which can be solder or any other types of connections described above, including possibly metal wires; even though the connection is shown as flip-chip, non-flip-chip connection can also be used). Central region 108 is surrounded by a peripheral region 110 having polymer wires 124 attached to other top contact pads 118 as described below. Regions 108 and 110 can have any geometry, and are not necessarily adjacent to each other or surrounding one another.

Elements 116, 118, 120 can be positioned in area 108 and/or 110, and a single element may extend to both regions. If an element 116 is exposed at a surface the element may project from such surface, may be flush with such surface, or may be recessed relative to such surface and exposed through a hole or depression.

Polymer wires 124 are joined to some of contact pads 118. We refer to wires 124 as "polymer wires" even though they may include a non-polymer conductive coating 132 (e.g., metal) as shown in insert A: a polymer wire 124 includes a dielectric or conductive polymer core 130 covered by coating 132. Polymer wires 124 may include additional layers (not shown), e.g., a barrier layer and a seed layer between the polymer core 130 and the conductive coating 132 as described below (if such additional layers are conductive, they can be thought of as part of coating 132). Polymer wires 124 can extend upward from substrate 102S.

Exemplary polymer materials for core 130 are plastics and photosensitive materials. Exemplary plastic materials are polyimides, benzocyclobutene (BCB), epoxides, acrylics, polyamides, polyethylene terephthalate (PET), polyethylene, polypropylene, polystyrene, poly(vinyl chloride) resins, polycarbonates, and polyurethanes. In some embodiments, the polymer core 130 may include particulate materials and reinforcing particulate elements, which may be conductive or non-conductive. Exemplary materials for conductive coating 132 are metal (e.g. copper, gold, nickel, solder, aluminum or the like), or non-metal conductors (such as doped polysilicon or carbon), or an alloy or other combination of such materials. In exemplary embodiments, the polymer wires 124 range from about 1 to 500 μm in height and have a width of about 1 to 200 μm or below. The thickness of coating 132 may range from 0.2 to 15 μm. In some embodiments, the barrier and seed layers are conductive, and are part of coating 132, with a combined thickness as described above. In exemplary embodiments, the aspect ratio of the polymer wires 124 is about 3:1 or higher, and preferably between 5:1 and 50:1. These dimensions are exemplary; any other dimensions are possible.

The polymer core 130, in various embodiments, includes a polymer matrix containing any suitable amount of polymeric material and including non-polymer additives. For example, the polymer core 130 can include a composite of multiple polymers or particulates that are bound by polymer.

In some embodiments, the core 130 includes a ceramic instead of, or mixed with, a polymer. Suitable ceramic materials include alumina, silicon dioxide, zirconia, or any combination thereof. For simplicity of discussion, the core 130, which can include a polymer and/or ceramic, is referred to as "polymer core 130" or "core 130" herein.

In some embodiments, the polymer wires 124 are formed from conductive polymers. In some of these embodiments, coating 132 is omitted. Suitable conductive polymers include polypyrrole, polyethylenedioxythiophene, poly(p-phenylene vinylene)s, polyaniline and polythiophenes.

In certain embodiments, the polymer wires 124 include dummy wires or metal powders to increase mechanical rigidity and for thermal management. The dummy wires can strengthen and provide additional support to the encapsulant 128. By increasing mechanical rigidity, warpage of the overall structure can be reduced. The dummy wires may or may not be covered by solder and/or conductive coating 132.

The top ends or middle portions of the polymer wires 124 can be connected to contact pads of other ICs or IC assemblies or packaging substrates (e.g., interposers) or printed circuit boards (PCB), by solder, adhesive, bond wires, low temperature conductive bonds (e.g., gold or silver paste), or other techniques, e.g., known techniques used to connect different ICs. As shown, the conductive coating 132 forms a continuous metal coating over the polymer core 130. In other words, the coating 132 surrounds the core 130. In the embodiment shown, the top ends of polymer wires 124 are attached to contact pads of die 112.3 and 112.4. More particularly, die 112.1 has its contact pads attached to contact pads 112C of die 112.2 in area 108. Die 112.3 overlies the die 112.2 and extends into area 110, where its contact pads 112C are attached to polymer wires 124. Die 112.3 may or may not have contact pads attached to those of die 112.2. Die 112.4 has its contact pads attached to polymer wires 124 in area 110. Die 112.3 and 112.4 may have contact pads on top for connection to other circuits. These examples are not limiting.

Figure 4:
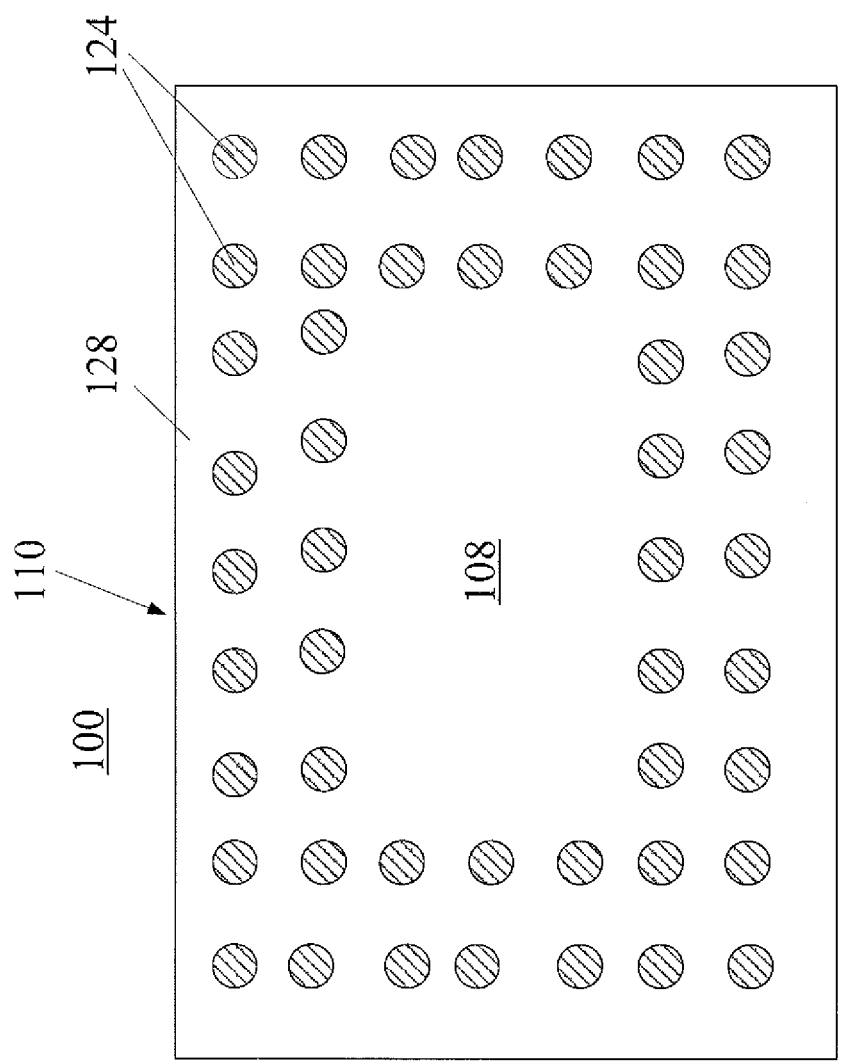
FIG. 4 is a plan view of a microelectronic assembly that includes a substrate with polymer wires according to some embodiments of the present disclosure.

Wires 124 can be arranged in any pattern. FIG. 4 is a top view of an exemplary array of wires 124. In this embodiment, each wire 124 is vertical. Polymer wires 124 and conductive elements 116 can carry multiple electronic signals therethrough, each having a different signal potential to allow for different signals to be processed by different microelectronic components in a single stack.

In the embodiment of FIG. 3, optional dielectric encapsulation layer 128 is formed over substrate 102S to cover die 112.1 and part of die 112.2 and to laterally encapsulate polymer wires 124 to help in fixing the wires in their positions. If desired, another such layer (e.g., underfill, not shown) can be formed to encapsulate the top portions of polymer wires 124 and cover the bottom surfaces of die 112.3, 112.4; still another encapsulation layer (not shown) may cover the die 112.3 and 112.4. These details are not limiting. In some embodiments, die 112.1 and 112.2 are absent; all the contacts 118 are attached to polymer wires 124.

Encapsulation layer 128 and other possible underfill and encapsulation layers mentioned above serve to protect the encapsulated elements within microelectronic assembly 100, particularly polymer wires 124, and to make the structure more robust and more capable to withstand mismatches of coefficients of thermal expansion (CTE) in normal operation, testing, or during transportation or attachment to other microelectronic structures. The encapsulation layers can be formed by molding or spin-on and then curing, or possibly other processes; exemplary dielectric materials for encapsulation layers are described in U.S. Pre-Grant Patent Publication No. 2010/0232129 et al., which is incorporated by reference herein in its entirety.

Encapsulation layer 128 can be formed before the placement of die 112.3 and 112.4, and can cover the die 112.2.

Figure 5:
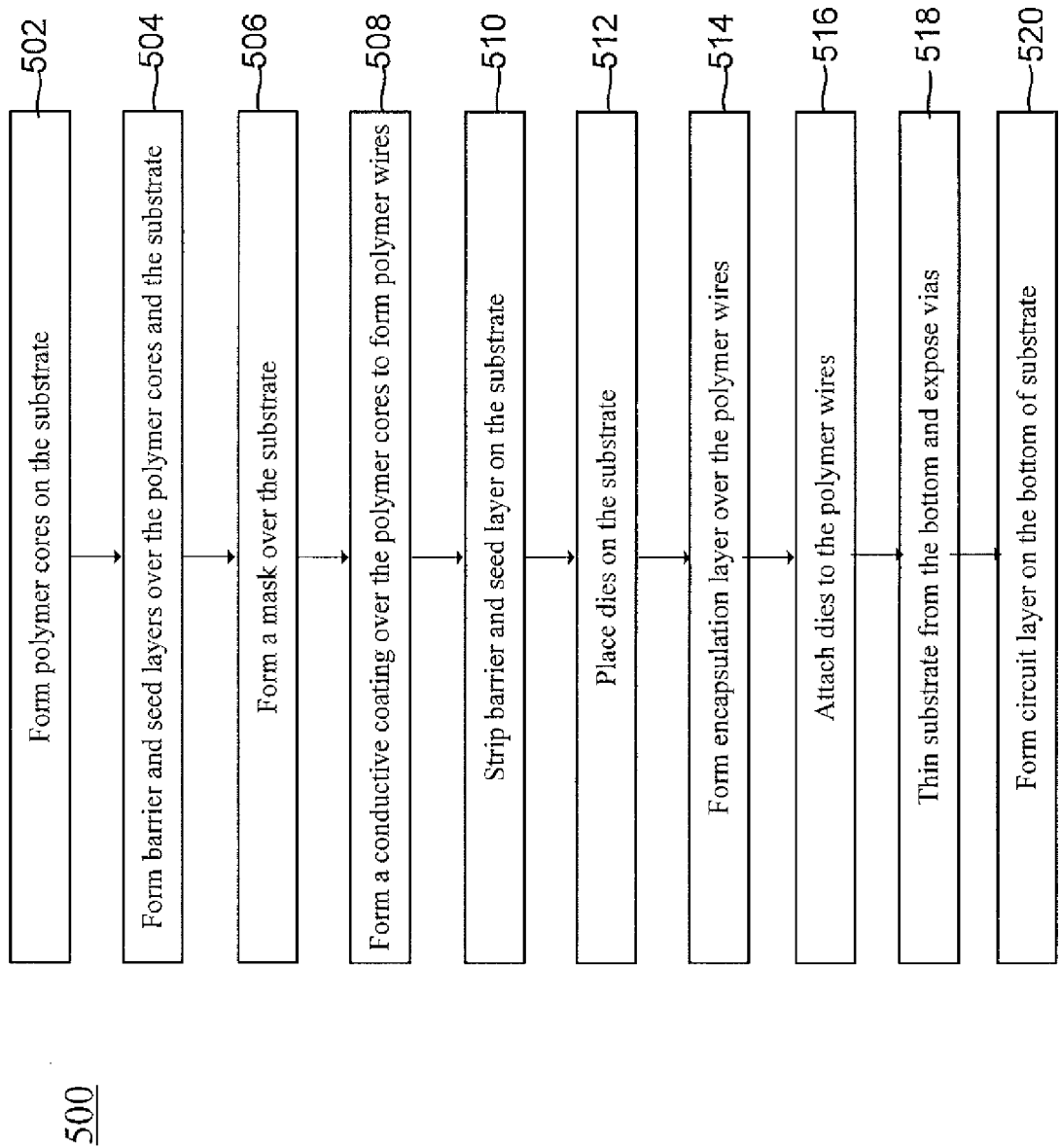
FIG. 5 is a flowchart of a method of fabricating a microelectronic assembly that includes a substrate with polymer wires according to some embodiments of the present disclosure.

An exemplary manufacturing method 500 for an assembly such as 100 is illustrated in the flowchart of FIG. 5. Some of the structures obtained at intermediate fabrication stages are shown in subsequent figures starting at FIG. 6A. For ease of illustration, fabrication will be described for the structure of FIG. 3, but the invention is not limited to this structure or fabrication method.

Substrate 102S can be processed if needed to fabricate all or part of circuitry 116 and circuit layers 104. Different circuit elements can be fabricated before, during, or after various steps in fabrication of polymer wires 124. In the example of FIG. 6A, substrate 102S is processed to fabricate circuit layer 104.T but not 104.B, and to possibly fabricate all other circuit elements 116 except for those below the substrate 102S. Also, the TSVs 122 are blind vias at this stage, i.e., terminating inside the substrate 102S (substrate 102S will be thinned to expose the TSVs on the bottom). The circuitry can be fabricated, for example, as described in U.S. patent application Ser. No. 14/214,365, filed Mar. 14, 2014 by Invensas Corporation, and U.S. Provisional Patent Application No. 61/952,066, filed Mar. 12, 2014 by Shen et al., both incorporated herein by reference. More particularly, holes are made in the top surface of substrate 102S for the TSVs, and are lined with dielectric 324 if desired (e.g., if substrate 102S is monocrystalline silicon or other non-dielectric material that needs to be electrically insulated from the TSVs). The holes are then filled or lined with the TSV material, which is conductive. For example, the TSV material can be formed by electroplating: first, barrier and seed layers are deposited (not shown separately), then a conductive material (e.g. copper) is electroplated on the seed layer. If the barrier and seed layers are conductive, they can be thought of as part of the TSVs. The excess materials of the TSV and barrier and seed layer, i.e. those portions that are present above the substrate, can then be removed, possibly by chemical mechanical polishing (CMP), to leave the TSV material and the barrier and seed materials only in the holes. Alternatively, some of these material above the substrate 102S can be used to form circuit elements 116.

Then circuit layer 104.T is formed on the substrate to provide other circuit elements 116 and contact pads 118. An exemplary process is like one for a redistribution layer (RDL) described in the aforementioned U.S. patent application Ser. Nos. 14/214,365 and 61/952,066. All this can be done before the substrate 102S is thinned from the bottom to expose the TSVs; the substrate is still thick (e.g., 650 microns or thicker) as needed to provide mechanical strength and heat dissipation capabilities for subsequent fabrication steps.

The method 500 proceeds to step 502 where one or more polymer cores 130 are formed on substrate 102S; see FIG. 6B. In FIG. 6B, the polymer cores 130 are vertical cylinders, but they do not have to be vertical or cylindrical and can be any desired shape, for example, conical, square, rectangular, hemispherical, spherical, or tubular. They can be inclined or bent in different directions and by different amounts, as described with respect to the wire bonds in U.S. Pat. No. 8,618,659 to Sato et al., which is incorporated by reference herein in its entirety. See also U.S. Pre-Grant Patent Publication No. 2013/0313716 to Mohammed, which is incorporated by reference herein in its entirety. Note for example the non-vertical wire bonds in the '659 patent. In some embodiments, the polymer cores 130 are tapered, and their tips may have particular shapes, as described with respect to the wire bonds in U.S. Pre-Grant Patent Publication No. 2014/0036454 to Caskey et al., which is incorporated by reference herein in its entirety. It should be understood that the description of the wire bond shapes in the '659 patent and the '454 publication apply to the polymer cores 130 and the resulting polymer wires 124 in the present disclosure.

The polymer cores 130 can be fabricated from a variety of materials that are compatible with the substrate 102 and the encapsulating materials such as 128. In some embodiments, the polymer cores 130 are formed from a plastic or a photosensitive material. Exemplary plastic materials include polyimides, benzocyclobutene (BCB), epoxides, acrylics, polyamides, polyethylene terephthalate (PET), polyethylene, polypropylene, polystyrene, poly(vinyl chloride) resins, polycarbonates, and polyurethanes. The polymer cores 130 can be applied, for example, by a screen printing method, by stenciling, coating, masking, stamping, heat stamping, dispensing a flowable material using a liquid capillary, spray coating, direct spreading, affixing a preformed material using an adhesive (e.g., a cylindrical object, an adhesive-backed decal), or other suitable method known and used in the art. The polymer cores 130 can be a prefabricated plastic, formed into a desired configuration, for example, by injection molding, extrusion, blow molding, compression molding, transfer molding, thermoforming, and among other methods. Useful adhesive materials for attaching the polymer cores 130 to the substrate 102 are known in the art, and include conductive, anisotropic and dielectric adhesives, e.g., contact adhesives, thermoplastic adhesives and thermosetting adhesives, for example, an adhesive gel or paste such as a conventional epoxy or polyimide die bonding adhesive, and/or a double-sided adhesive tape such as polyimide, and can be used to apply the polymer core 130 under pressure and/or heat. The cores 130 can be attached one by one or altogether.

Figure 6C:
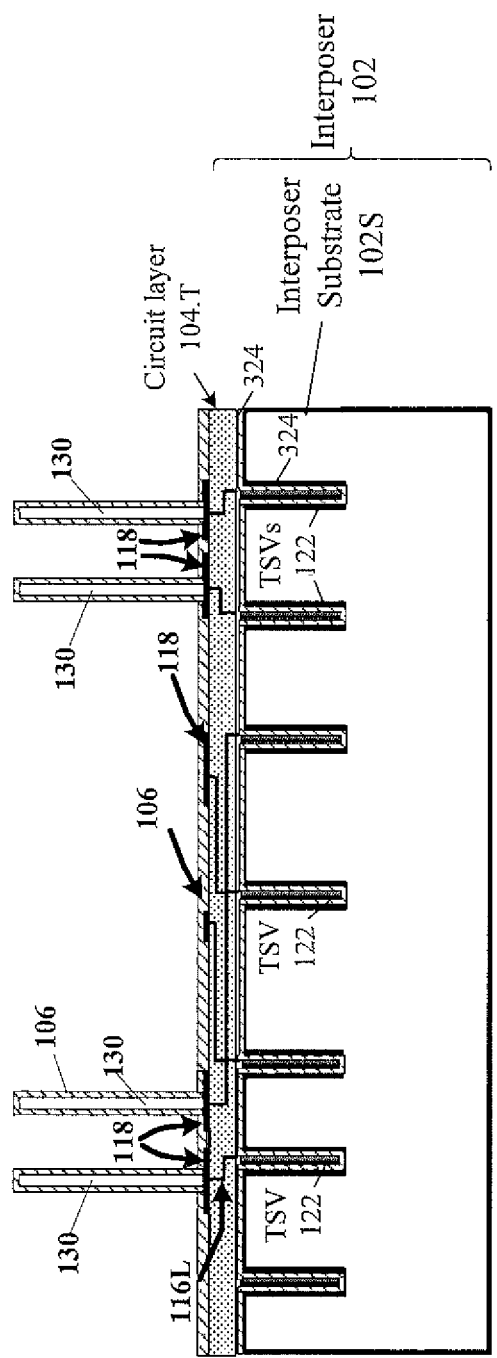
Figure 7A:
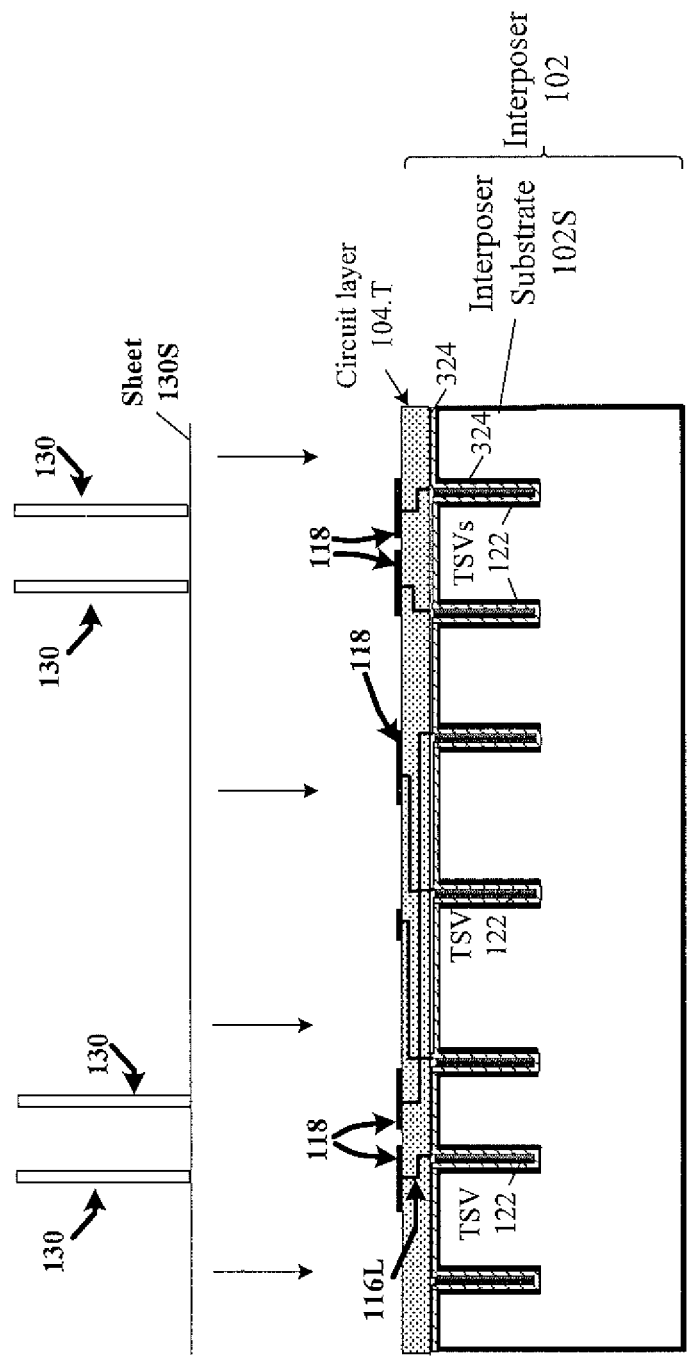
FIGS. 7A-7B are vertical cross-sectional views of a microelectronic assembly at different stages of fabrication according to some embodiments of the present disclosure.

In the example of FIG. 7A, the polymer cores 130 are formed as integral with a polymer sheet 130S; the sheet is then attached to the top surface of substrate 102 of FIG. 6A to cover the substrate; and then the polymer is subjected to a partial removal process (e.g., dry or wet blasting or other suitable process) to remove the sheet portions between the polymer cores 130 and expose the edges of the underlying contact pads 118 below the polymer cores: the polymer remains only in cores 130. This partial removal process may be a blanket process that removes a small polymer amount from cores 130.

Figure 7B:
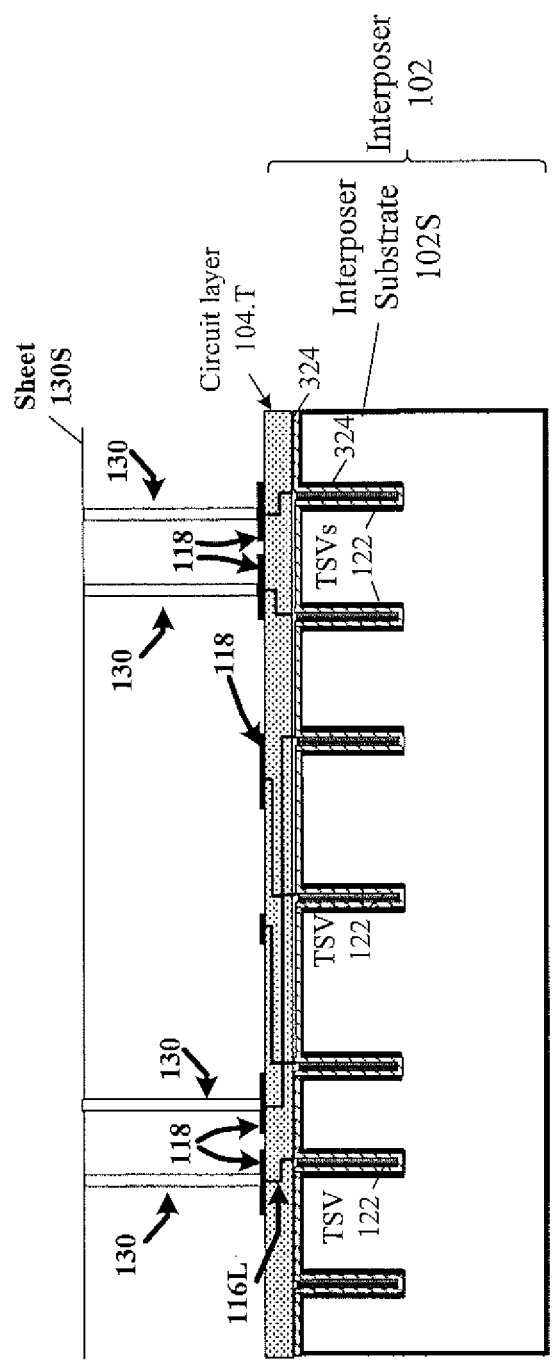

Alternatively, in FIG. 7B, the polymer cores 130 with sheet 130S can be placed on the substrate 102 "upside down", i.e., with the polymer cores below the sheet. The sheet is then removed by any of the processes described above.

At step 504 (FIG. 5), a barrier layer and seed layer are formed over the polymer cores 130 and substrate 102. In FIG. 6C, a barrier layer (not separately shown) and seed layer 106 are applied on the polymer cores 130 and substrate 102. For example, a barrier layer (metal or dielectric, not shown separately) is formed first on the polymer cores 130 and substrate 102 to aid in metal adhesion and prevent metal diffusion into the substrate 102. Suitable barrier layers may include a layer of titanium-tungsten (see U.S. Pre-Grant Patent Publication No. 2012/0228778 to Kosenko et al., which is incorporated in its entirety herein by reference), and/or nickel containing layers (see U.S. Pre-Grant Patent Publication No. 2013/0014978 to Uzoh et al., which is incorporated in its entirety herein by reference). The barrier layer can be formed by sputtering, atomic layer deposition, electroless plating, electroplating (if for example the polymer cores 130 and the top surface of substrate 102 are conductive to carry the plating current), or possibly other processes.

Seed layer 106 of a catalyst material is then deposited over the barrier layer. Seed layer 106 can be deposited on the polymer core 130 and the substrate 102 by, for example, a bath, including an electroless or electroplating bath, or physical vapor deposition (PVD), e.g. sputtering, atomic layer deposition, or evaporation. Seed layer 106 may include palladium, ruthenium, gold, copper, nickel, aluminum, or combinations thereof. An exemplary thickness of the seed layer may vary from 5 to 200 nm. These examples are not limiting. In some embodiments, seed layer 106 may also serve as a barrier layer.

Figure 6D:
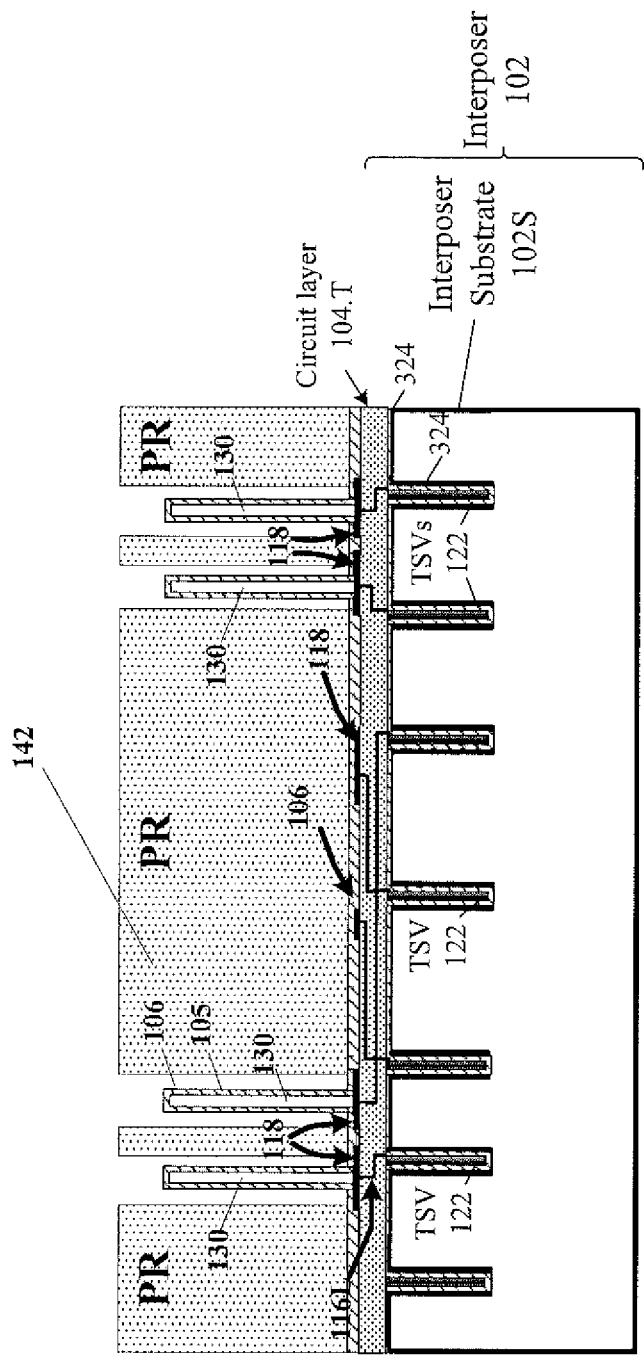

At step 506, a mask is formed over the substrate. In FIG. 6D, the mask is a patterned photoresist layer 142 formed on the substrate 102 between the polymer cores 130 and spaced from the polymer cores. Photoresist ("PR") 142 can be higher than the polymer cores 130, but this is not necessary. Photoresist 142 can be formed using conventional techniques. For example, in some embodiments, photoresist 142 is formed over the substrate 102 by a suitable process, e.g., spin-on coating, to cover all the areas between polymer cores 130 and possibly (but not necessarily) to cover the polymer cores 130. Then the resist 142 is patterned by photolithography or electron beam lithography or some other patterning method. For example, the patterning may include exposure of the resist through a mask (as in photolithography), post exposure baking of the resist, and developing the exposed resist to leave the resist only in desired areas between the polymer cores 130. The seed layer's sidewalls 105 over polymer cores 130 are spaced from the resist layer 142 to enable subsequent metal plating on the sidewalls 105.

Resist 142 is optional as further explained below, and one advantage of using the resist is that it blocks plating on the underlying seed layer and thus reduces the plating area and hence increases the plating rate if the metal is not plated on the resist of if the metal is plated on the resist but at a lower rate than on the seed layer. The resist increases the plating rate on the seed layer because more metal ions are available for plating per unit area. Also, in case of electroplating, the electric current density is increased for a given supply of current. In some embodiments, since resist 142 does not allow the metal to be plated on the underlying seed layer 106 between the cores 130, the resist 142 will help to electrically insulate the polymer wires 124 from each other: the wire isolation will not require subsequent removal of the plated metal.

In other embodiments, the wire isolation may require removal of plated metal because the plated metal on top of polymer cores 130 could bridge, i.e., grow sideways so as to meet between different cores 130 over the resist. Making the resist 142 higher than the polymer 130 at the stage of FIG. 6D helps to avoid such bridging, but bridging could also be avoided if the resist 142 is not higher than the cores 130. For example, bridging could be avoided by terminating the plating process before the bridging occurs.

If the bridging occurs (not shown), the bridging metal portions can be removed after plating, by a suitable masked or blanket etch or by chemical mechanical polishing (CMP) for example.

Figure 6E:
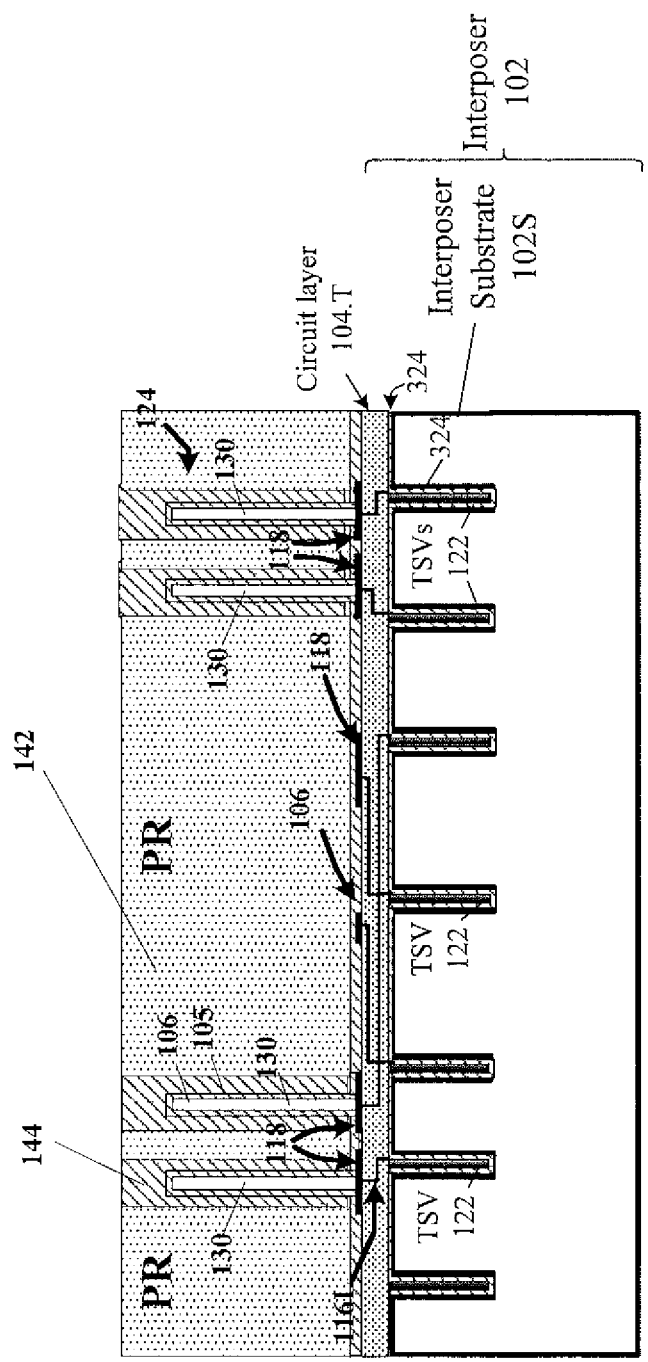

At step 508, a conductive coating is formed over the polymer cores to form the polymer wires. Turning now to FIG. 6E, the conductive coating 144, possibly metal, is formed over and on exposed portions of the seed layer 106, including the portions of the seed layer 106 over the polymer cores 130 and the seed layer portions between the cores 130 and the resist 142 (e.g., sidewalls 105). Metal layer 144 may be formed by various processes, such as electroless plating or electroplating. The metal layer 144 can include copper, silver, nickel, metal alloys, solder, or combinations thereof. In some embodiments, the barrier layer, seed layer 106, and conductive layer 144 are the same material or include materials with similar compositions. Each of these layers may include multiple layers of different compositions.

Metal layer 144 is an example of conductive coating 132 of FIG. 3. If seed layer 106 and the barrier layer are conductive, they can be considered as part of coating 132 as noted above. In some embodiments, the seed and/or barrier layer are omitted (for example, the seed layer can be omitted if metal 144 is deposited by methods other than electroplating, e.g. by sputtering, printing, selective deposition methods such as electroless plating, or some other non-plating method).

Polymer wires 124 are formed by the polymer cores 130, overlying metal coating 144, and any intermediate layers if present, e.g. the barrier and seed layers.

If conductor 144 is plated or otherwise deposited to spread out over the resist 142, CMP or other planarizing process can be applied if desired to remove the conductor 144 from over the resist and provide a planar top surface.

Figure 6F:
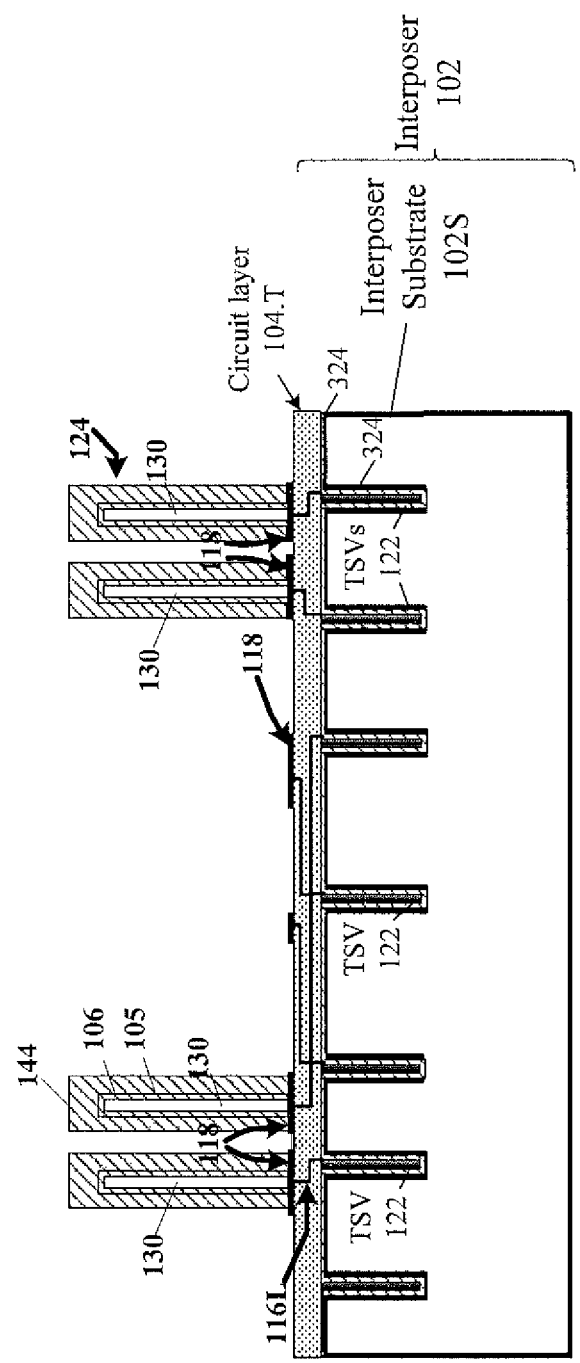

Then, at step 510 (see FIG. 6F), the photoresist 142 and the underlying portions of the seed layer 106 and barrier layer are stripped. Photoresist 142 may be removed by any suitable process, such as wet stripping or oxygen plasma ashing. Any suitable method for removing the seed layer 106 and the barrier layer can be used, such as mechanical or chemical etching or the like. Wet or dry blasting may also be used to remove the seed and barrier layers and, possibly, the photoresist 142. All these processes do not remove the metal 144 or remove just a part of the metal layer to leave a continuous metal coating 144 over the polymer cores.

In some embodiments, some or all of the photoresist layer 142 is not removed and remains permanently on the interposer 102. This is appropriate, for example, if the barrier and seed layers are not conductive or are absent so as not to electrically short the polymer wires 124 to each other.

Figure 6G:
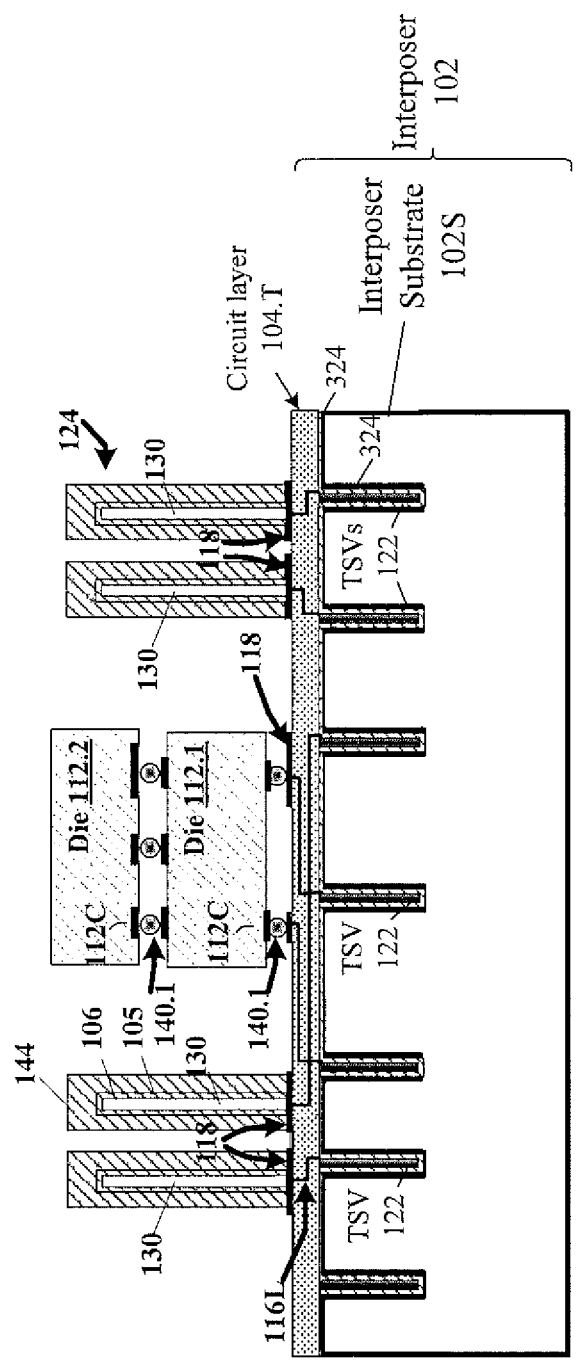

At step 512 illustrated in FIG. 6G, dies 112.1 and 112.2 are placed on the substrate 102. The top contact pads 118 are attached to contact pads 112C of the die 112.1 by connections 140.1. Die 112.2 is, in turn, attached to due 112.1 through contact pads 112C of the dies 112.1 and 112.2 and the connections 140.1.

Figure 6H:
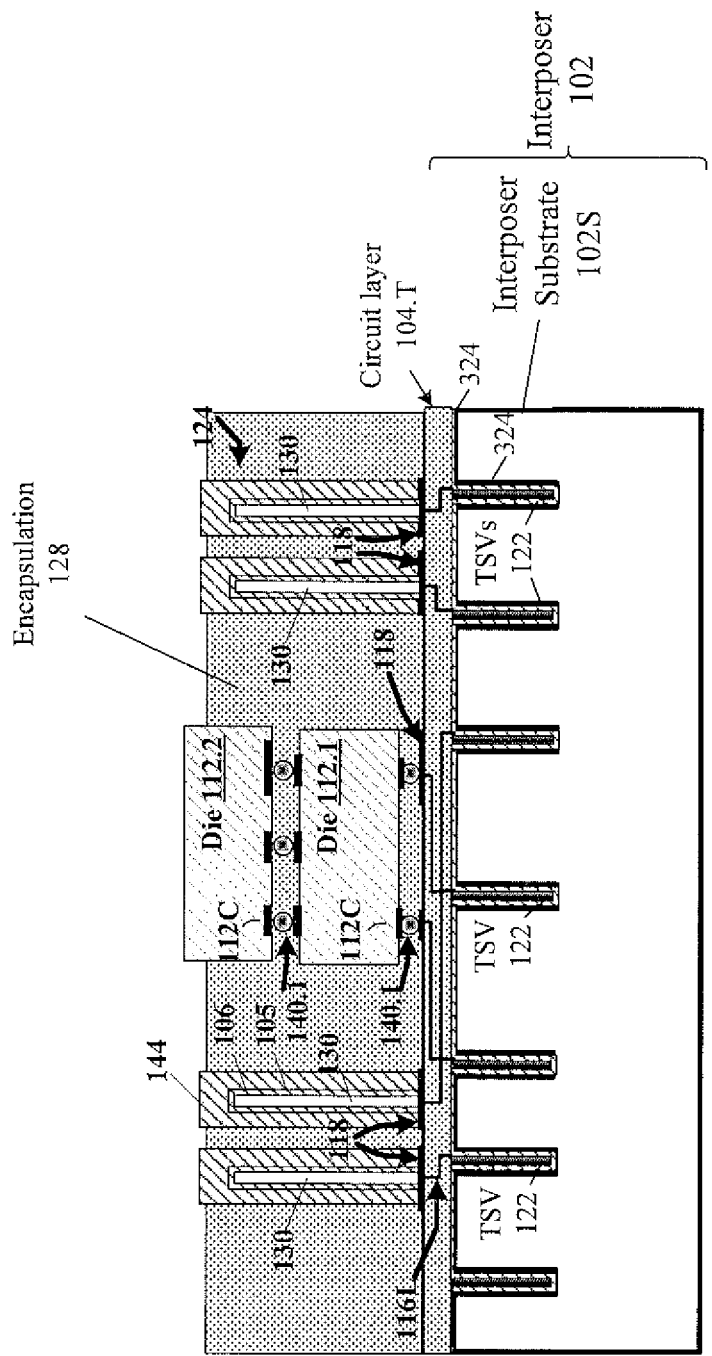

At step 514 illustrated in FIG. 6H, a die underfill and encapsulation layer 128 is formed over the polymer wires 124. In some embodiments, the encapsulation layer 128 is a flowable material deposited by molding or a spin-on process and then hardened by curing. The encapsulant 128 covers and fills gaps between the wires 124 and under the dies 112.1 and 112.2. The encapsulant 128 can be a polymer composite material, such as epoxy resin with filler, epoxy acrylate with filler, or polymer with proper filler. The encapsulant 128 is non-conductive and environmentally protects the microelectronic component from external elements and contaminants.

The layer 128 initially covers the wires 124, but is later ground to expose the top metal surfaces 144 of the wires 124 for access from the outside world. The grinding can be replaced, or be used with, CMP or wet or dry blasting or possibly some other process. In some embodiments, the resulting top surface of encapsulant 128 is planar (or almost planar). Planarity facilitates die attachment as described immediately below, but planarity is not necessary.

Figure 6I:
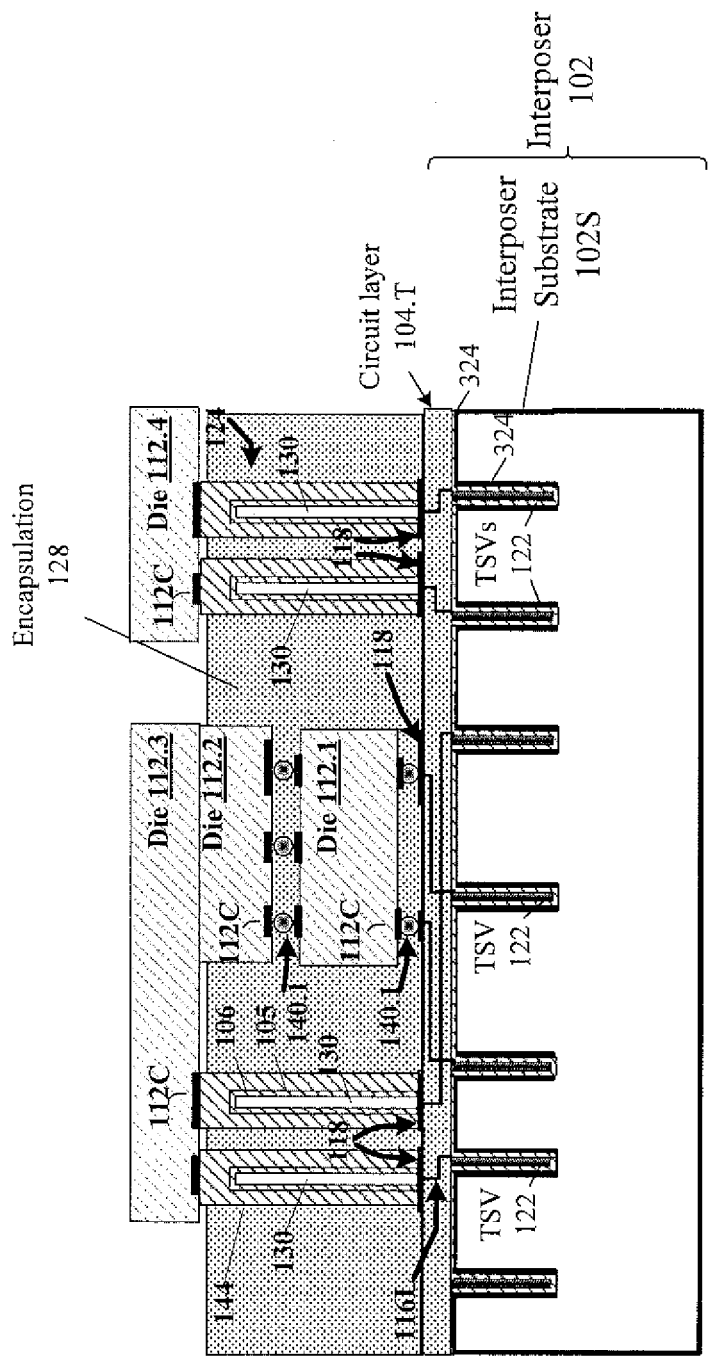

At step 516, the dies 112.3 and 112.4 are attached to the polymer wires 124 as shown in FIG. 6I. Additional encapsulation is possible at this stage. For example, the dies 112.3 and 112.4 may be encapsulated.

Figure 6J:
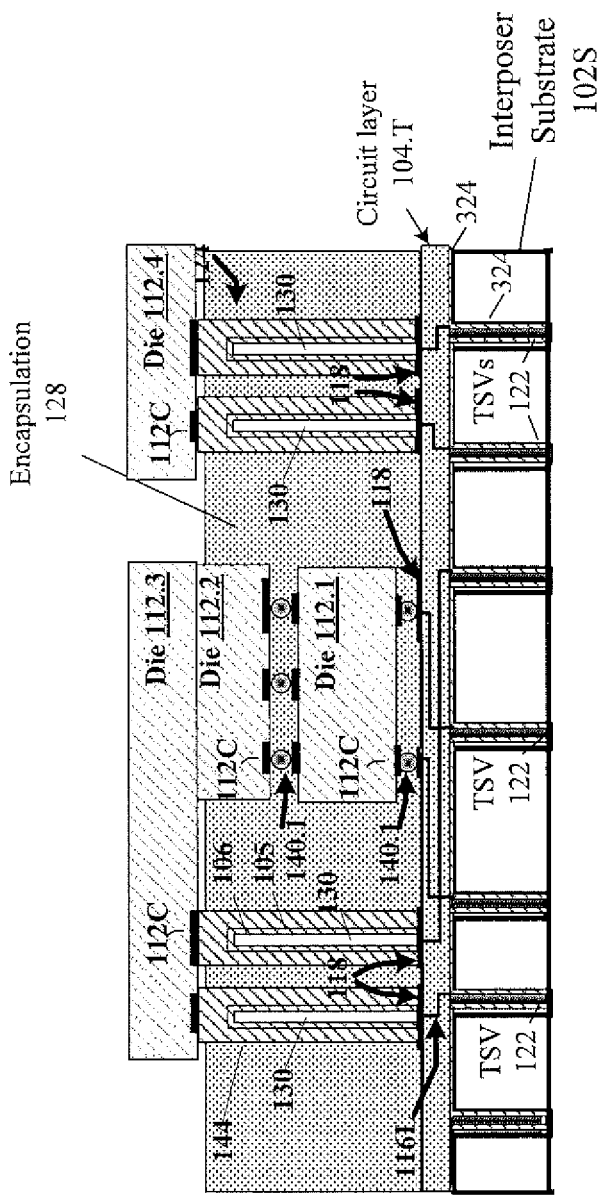

At step 518, the substrate 102S is thinned from the bottom, and the bottom portion of the dielectric 324 is removed to expose the TSVs as shown in FIG. 6J. Finally, at step 520, the circuit layer 104.B is formed on the bottom to form the structure of FIG. 3. It should be understood that the circuit layers are optional.

Figure 8A:
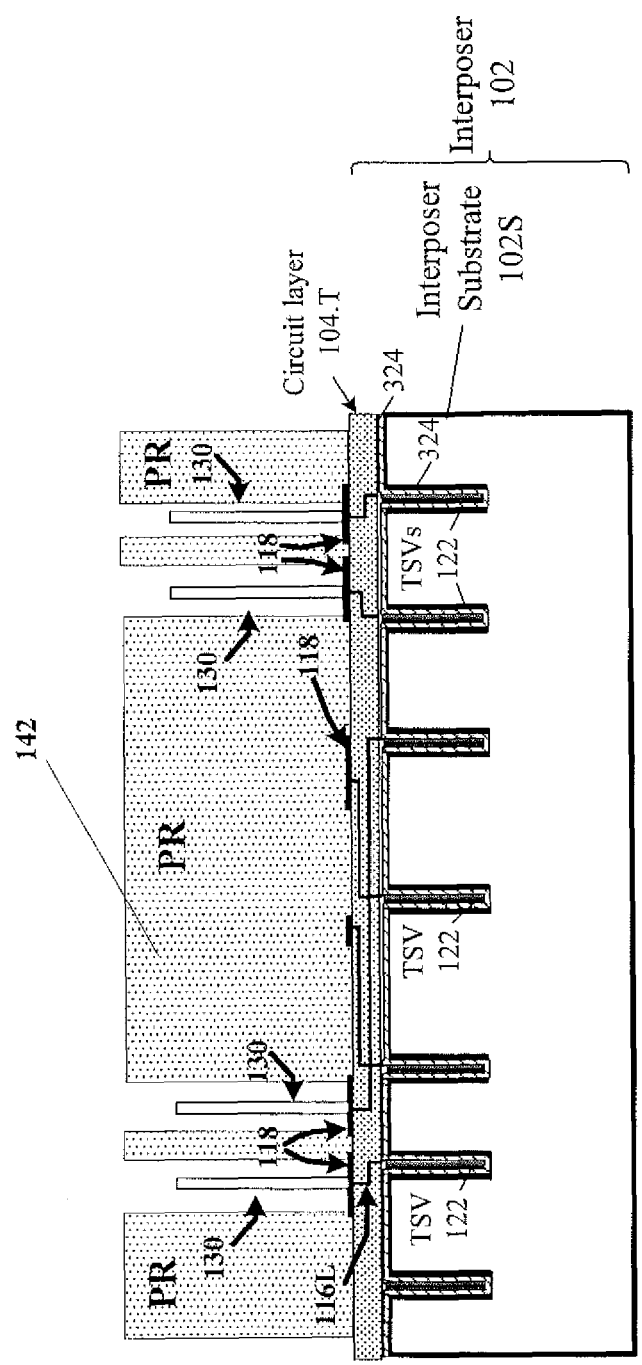
FIGS. 8A-8C are vertical cross-sectional views of a microelectronic assembly that includes a substrate with polymer wires according to some embodiments of the present disclosure.
Figure 8B:
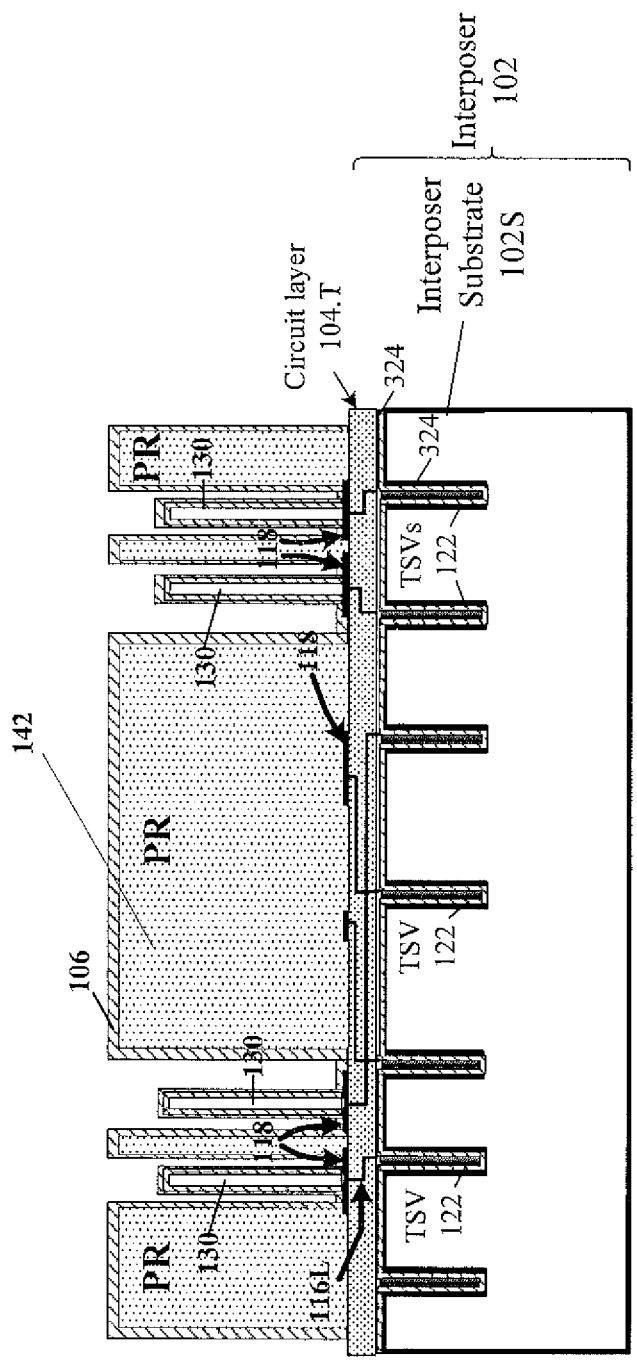
Figure 8C:
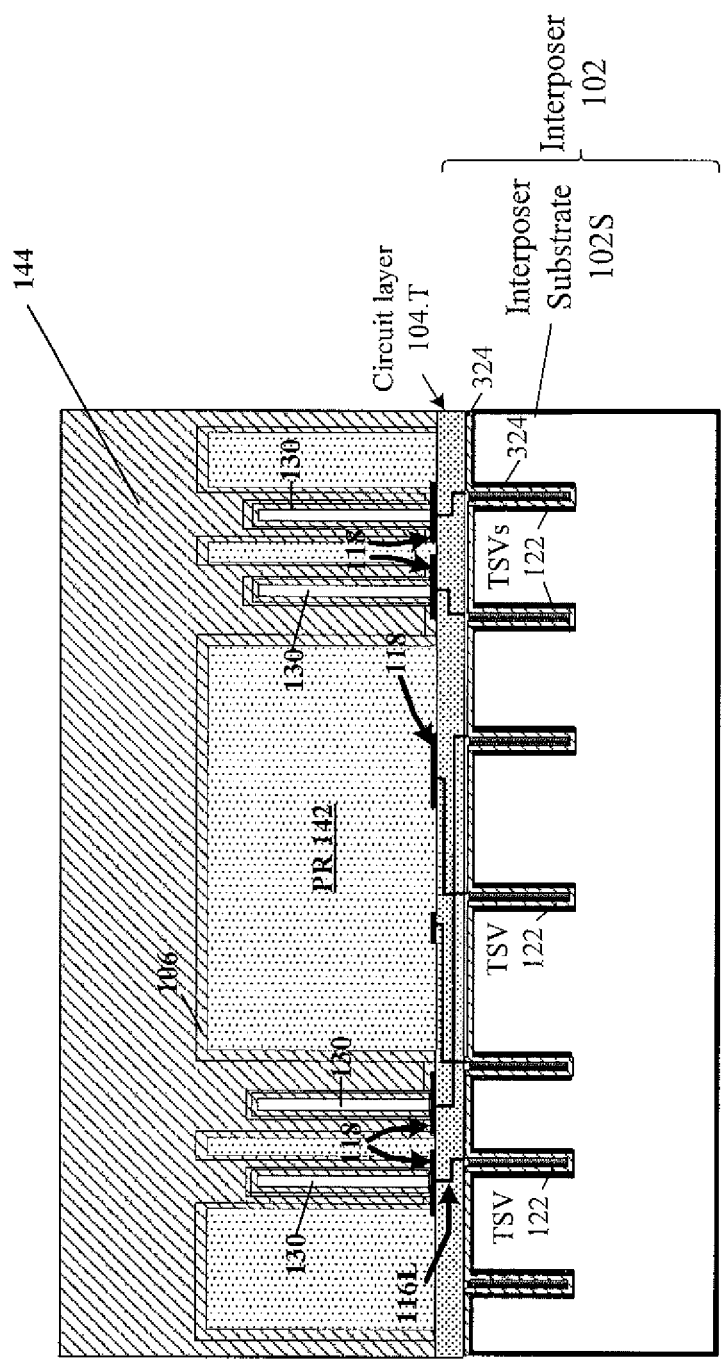

In certain embodiments, the seed layer is formed after the resist layer, and covers the photoresist, rather than being under the resist layer as shown in FIG. 6D. Referring now to FIG. 8A, the patterned photoresist layer 142 is formed first, and can be higher than the polymer cores 130. Next, in FIG. 8B, a seed layer 106 is deposited over the resist 142 and the cores 130. Then (FIG. 8C), metal 144 is plated on the seed layer 106. In this embodiment, the plated metal 144 is allowed to bridge, but the bridges can be removed after the plating. (Bridging could be avoided by suitable patterning or masking of seed layer 106 before plating.) For example, this could be done by a masked or blanket etch of the metal or by CMP. In various embodiments, CMP is then performed on the top of the seed layer 106 to expose the resist 142, which as illustrated is higher than the polymer cores 130. Finally, the resist layer 142 is stripped if desired, to obtain the structure of FIG. 6F. Subsequent processing can be as described above for FIG. 6F.

Figure 9A:
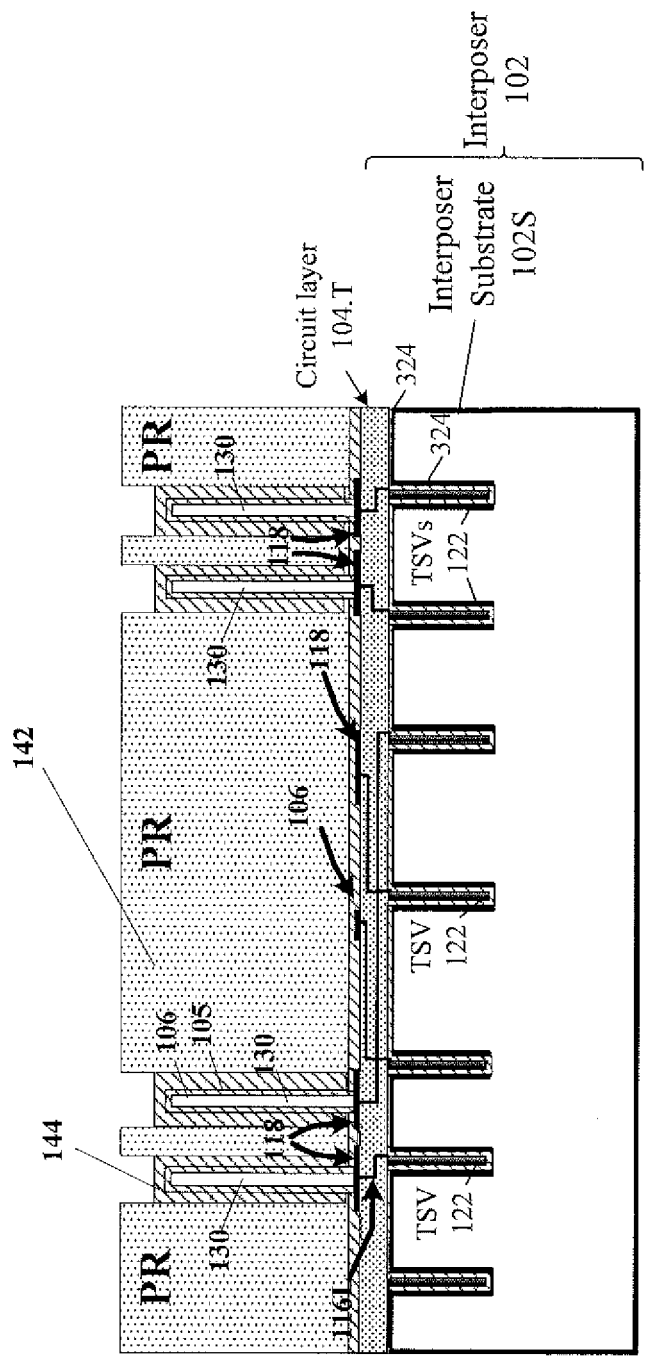
FIGS. 9A-9D are vertical cross-sectional views of a microelectronic assembly that includes a substrate with polymer wires at different stages of fabrication according to some embodiments of the present disclosure.
Figure 9B:
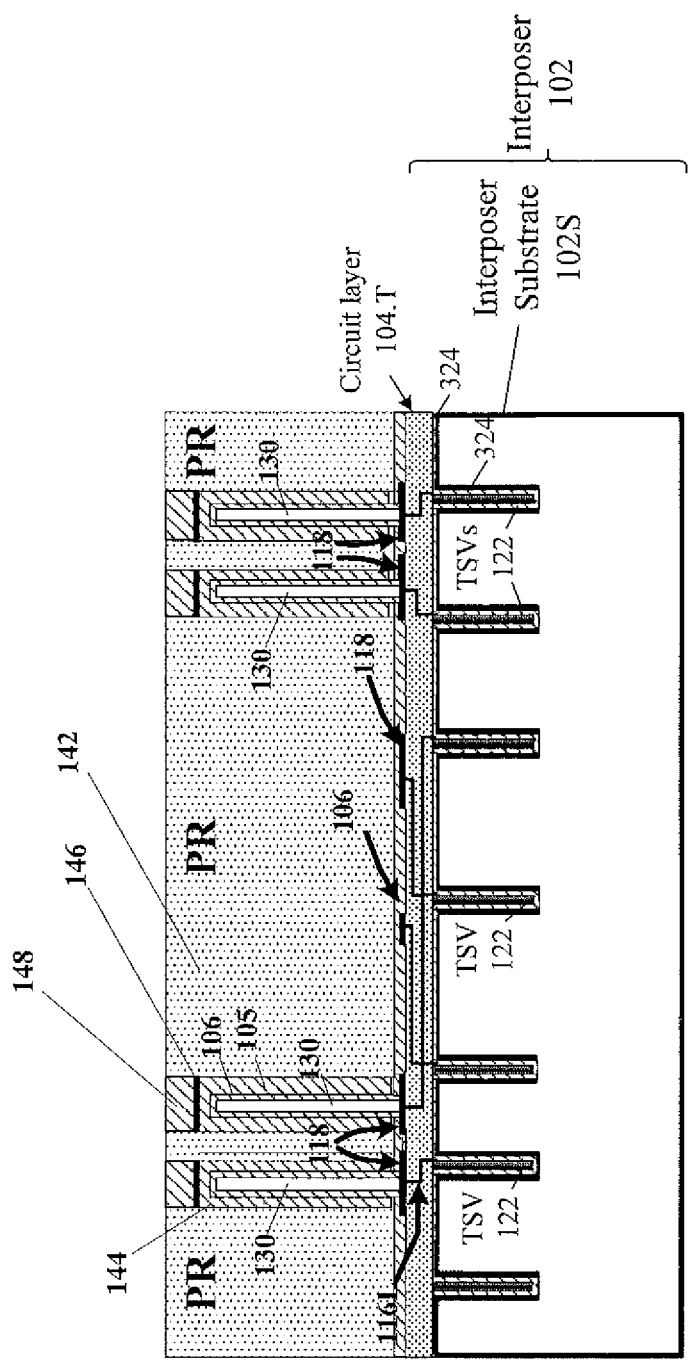

FIGS. 9A-9D illustrated other variations that may facilitate solder deposition on polymer wires 124 or alignment between the wires 124 and overlying structures. FIG. 9A illustrates the same structure as in FIG. 6E (after plating of metal 144) except that the metal 144 is not allowed to reach the top surface of resist 142 (by early termination of plating for example).

If needed (FIG. 9B), a barrier layer (not shown) and seed layer 146 (possibly copper, silver or nickel) are plated over the metal layer 144 for subsequent solder plating. Then solder 148 is plated onto the seed layer 146. The solder 148 cannot enter the spaces between the resist 142 and the polymer wires 124, so the solder 148 cannot form on the wires' sidewalls. (It may be desirable not to allow the solder to be formed on the wires' sidewalls in order to maintain the sidewall shape during subsequent solder reflow.) Solder 148 will form on top of the polymer wires 124. If layer 144 is copper, then the barrier layer, if needed, can be nickel or a nickel alloy. In an exemplary embodiment, copper is plated on the polymer cores 130; then nickel or nickel alloy(s); then solder.

Figure 9C:
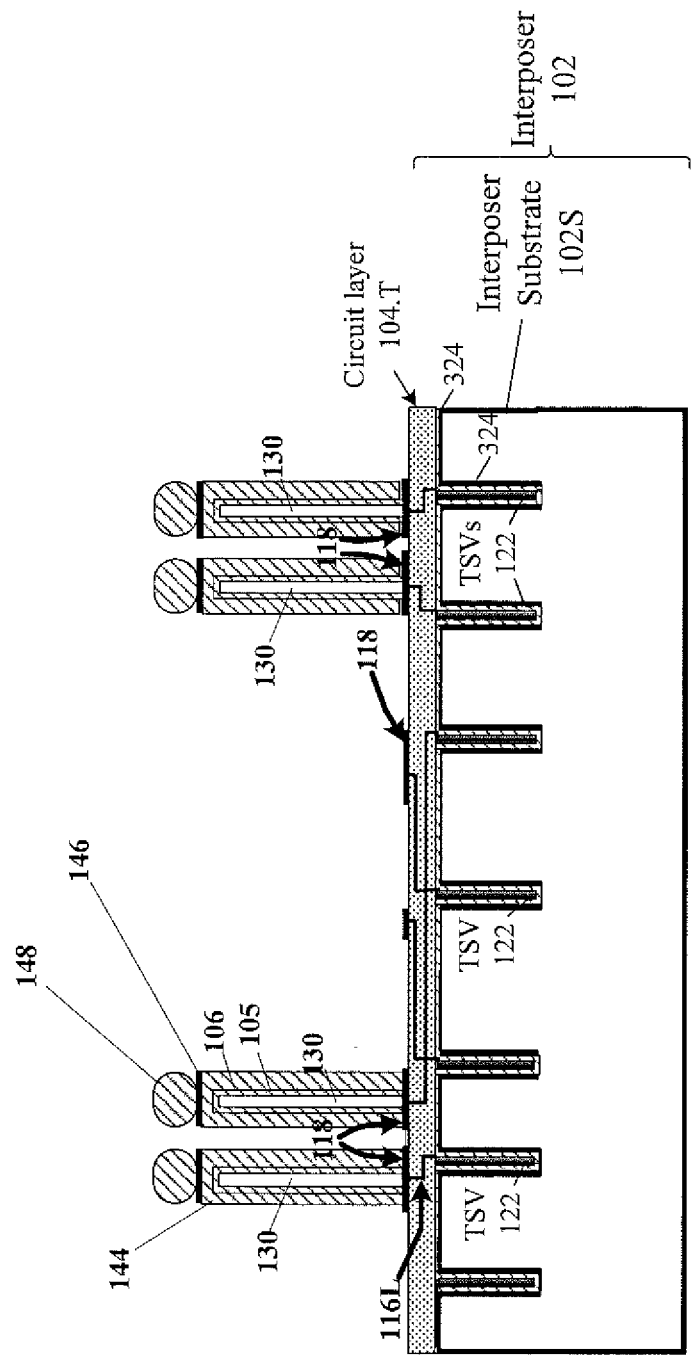
Figure 9D:
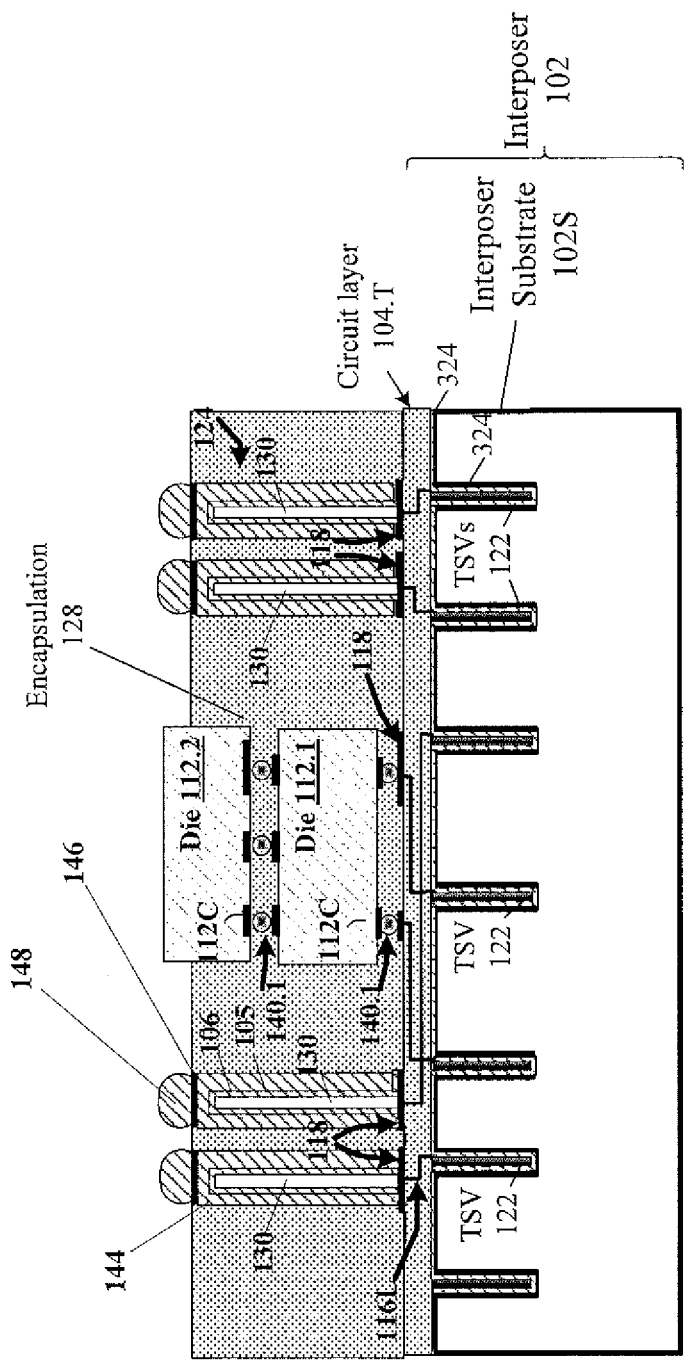

FIG. 9C illustrates that the resist layer 142 and portions of the seed layer 106 are then stripped, the workpiece is cleaned, and then solder 148 is reflowed. When the solder 148 is reflowed, the solder 148 generally becomes spherical on top. The solder 148 is prevented from flowing down the sidewalls of the polymer wires 124 because the solder 148 wets the seed layer 146 better than the metal 144 during reflow. This is desirable in order to retain the high solder volume on top for subsequent attachment to die or other circuits.

Subsequent fabrication steps can be as discussed above. In the variation shown in FIG. 9D, die 112.1 and 112.2 have been attached to interposer 102, and an encapsulant layer 128 is formed to laterally encapsulate the polymer wires 124. The encapsulant layer may or may not reach the sidewalls of solder 148. All the manufacturing variations described above are applicable to these embodiments.

In other embodiments, the solder is plated after forming encapsulation 128.

Figure 10:
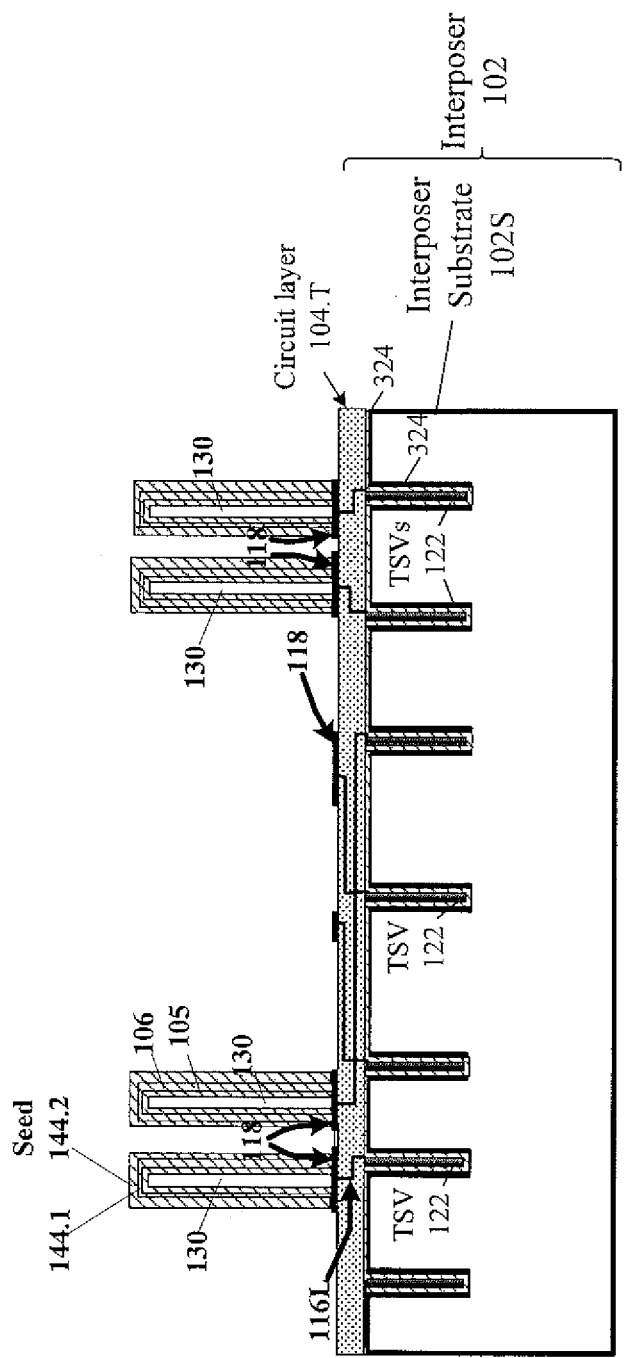
FIG. 10 is a vertical cross-sectional view of a microelectronic assembly that includes a substrate with polymer wires according to embodiments of the present disclosure.

In the embodiments described above, conductive coating 144 may include multiple conductive layers, and further in some embodiments the barrier layer (not shown) and the seed layer 146 for solder deposition are formed as part of layer 144. See FIG. 10, showing the structure at the stage of FIG. 6F (after removal of resist 142): layer 144 may include layer 144.1 as in FIG. 6F, and another layer 144.2 serving as seed layer 146 of FIG. 10 for subsequent solder plating (not shown), and may include a barrier layer in between. Exemplary materials for layer 144.1 are copper, copper alloys, nickel, and nickel alloys; if a barrier layer is needed, it may be made of nickel or a nickel alloy plated on metal 144.1; and copper or silver may provide seed layer 144.2. All of these layers can be plated one after another using the same resist mask 142 as described above for FIG. 6D. Alternatively, the layers can be deposited as in the other embodiments discussed above for layer 144, including the embodiments discussed in connection with FIGS. 8A-9D. Subsequent fabrication steps (such as die attachment and substrate 102S thinning) can be as described above.

Figure 11:
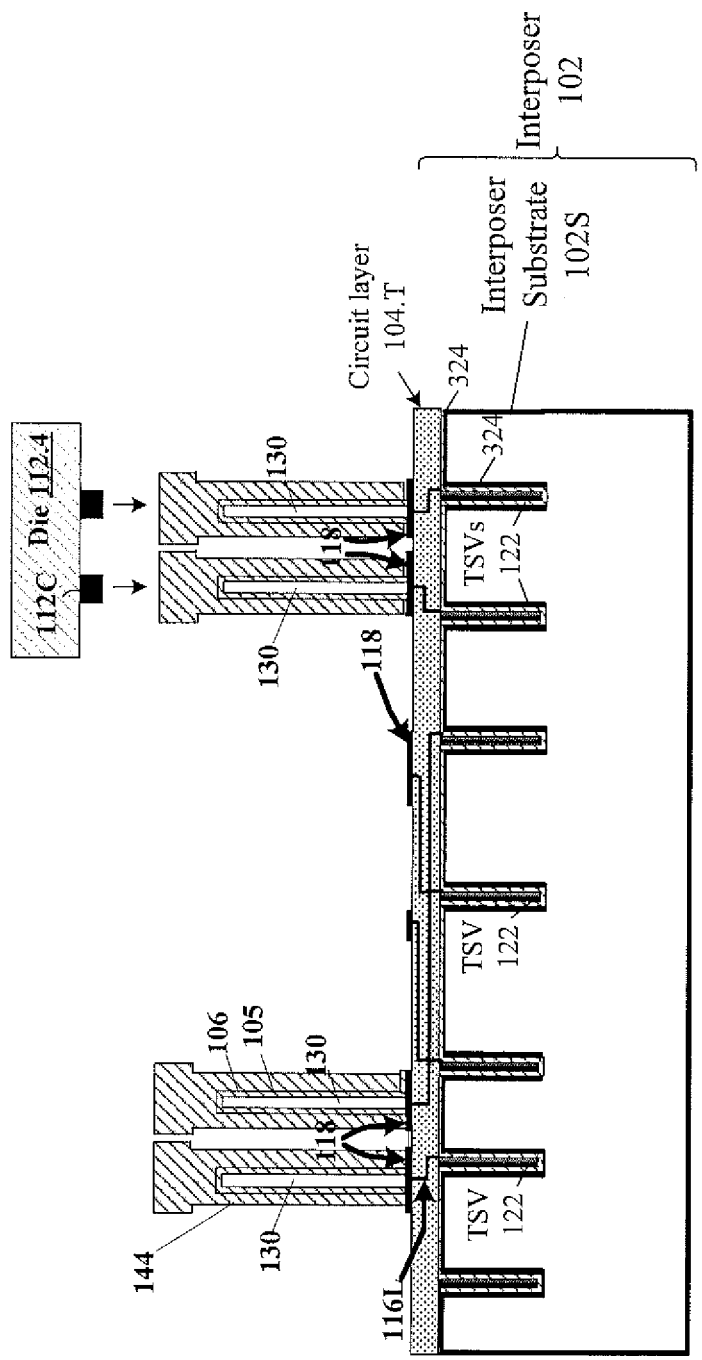
FIG. 11 is a vertical cross-sectional view of a microelectronic assembly that includes a substrate with polymer wires according to embodiments of the present disclosure.

As noted above, the tops of polymer wires 124 may have any kind of shape, and FIG. 11 illustrates an embodiment with mushroom-shaped tops for easier subsequent processing such as solder deposition on top (not shown) or alignment with other structures such as die 112.4 (not yet attached), which has protruding contacts 112C (e.g. copper posts or solder balls) that can contact the top of wires 124. As shown, the tops of the metal layer 144 are wider or extend farther laterally than the metal layer 144 closer to the substrate 102. The wider tops provide more area for electrical contact with other structures. The mushroom-shaped top can be achieved, for example, by allowing the plating operation of FIG. 6E to continue until the metal 144 spreads out over the resist 142 (as a mushroom); the mushrooming portion of metal 144 can be patterned to cause the mushroom to have a planar top surface as in FIG. 11, or a concave top surface, or any other desired shape.

Figure 12:
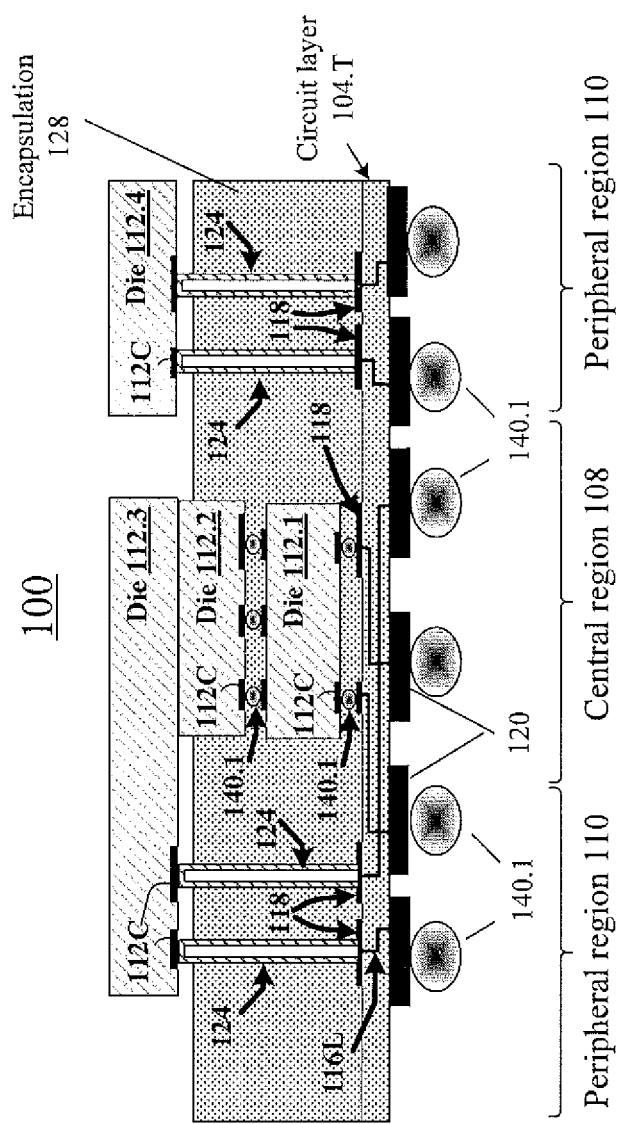
FIG. 12 is a vertical cross-sectional view of a microelectronic assembly that includes a substrate with polymer wires according to embodiments of the present disclosure.

In the embodiment of FIG. 12, substrate 102S is omitted in the final structure, and the interposer consists of circuit layer 104.T. The fabrication proceeds as in any process described above, starting with substrate 102S as a sacrificial substrate, except that there is no need to form TSVs 122 or any other circuits in substrate 102S. Substrate 102S is removed at a stage corresponding to FIG. 6J (substrate thinning). Contact pads 120 are made on the bottom surface of circuit layer 104.T.

If desired, after the substrate removal, another circuit layer (such as 104.B in FIG. 3, not shown in FIG. 12) can be formed on the bottom surface of layer 104.T to provide additional circuit elements and the contact pads 120.

Figure 13:
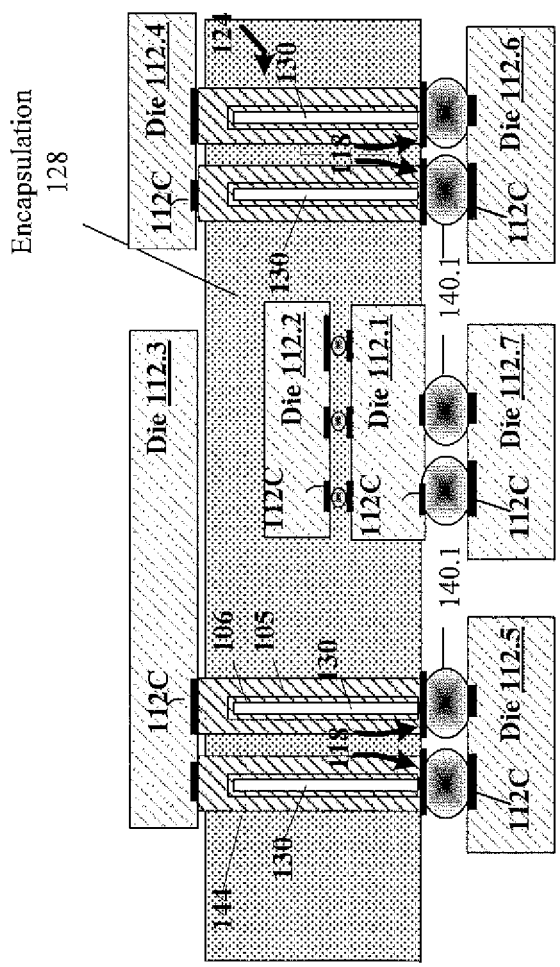
FIG. 13 is a vertical cross-sectional view of a microelectronic assembly without a substrate and with polymer wires according to embodiments of the present disclosure.
Figure 14A:
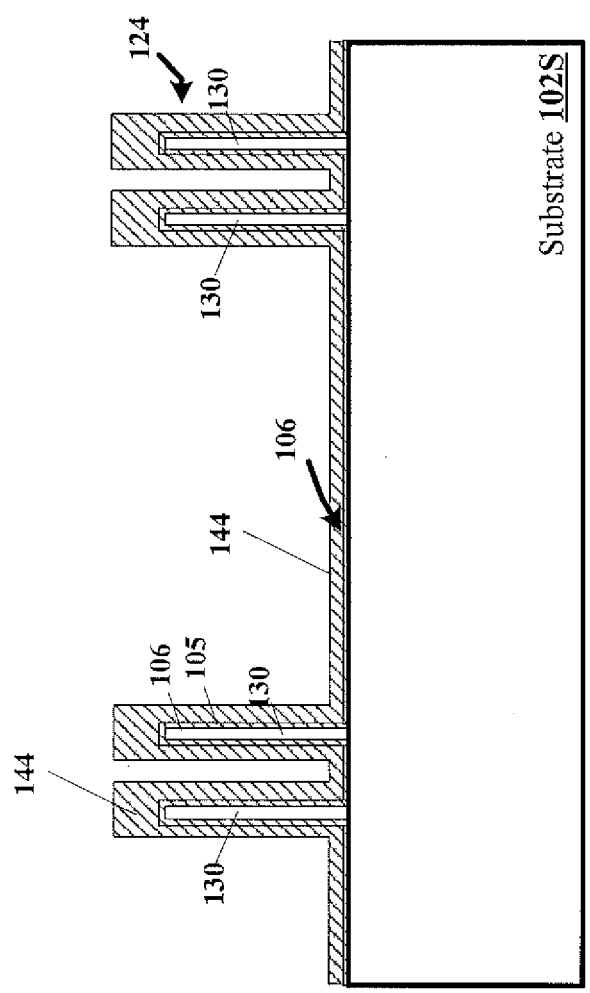
FIGS. 14A-14C are vertical cross-sectional views of a microelectronic assembly with polymer wires at different stages of fabrication according to some embodiments of the present disclosure.
Figure 14B:
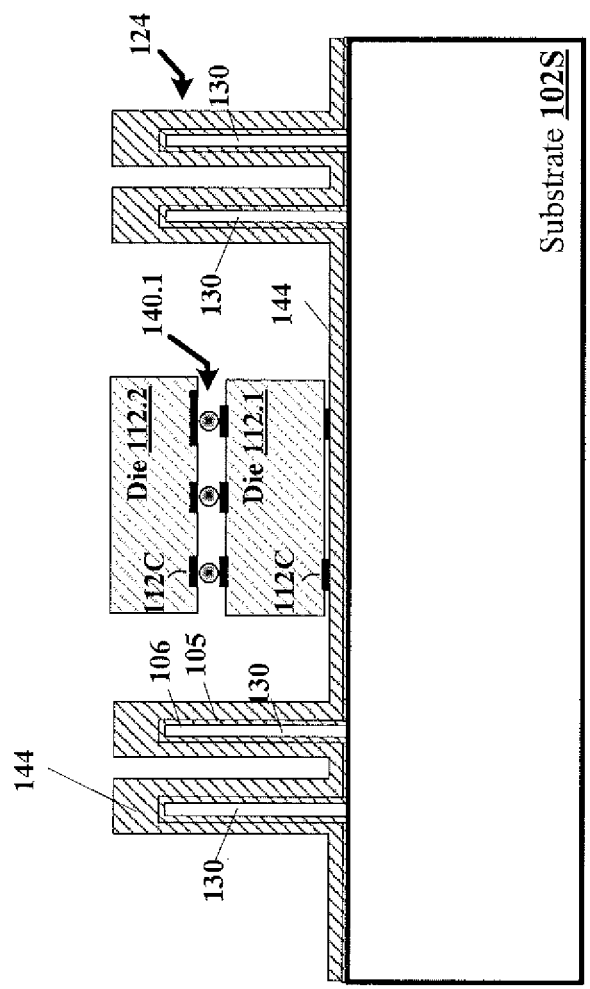
Figure 14C:
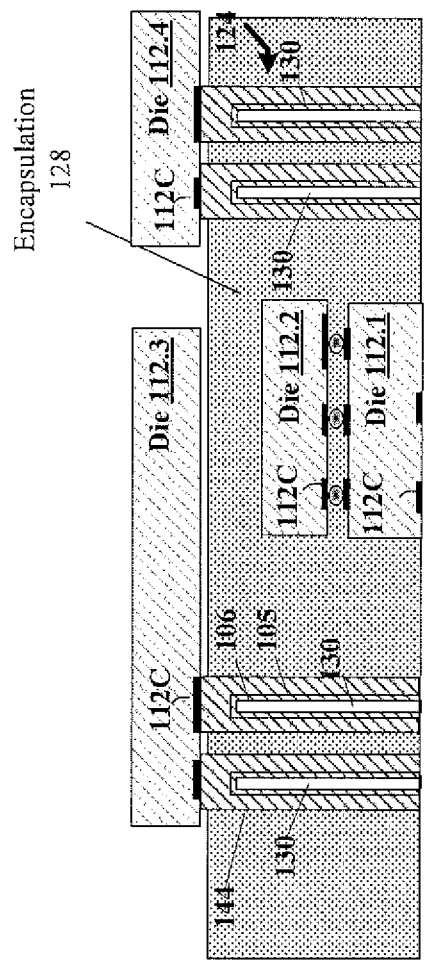

In FIG. 13, the interposer is absent. The fabrication proceeds as described above for FIG. 12, except that there is no circuit layer 104.T. Further, in some embodiments, photoresist 142 can be omitted, so the metal 144 and the underlying barrier and seed layers are formed over the entire sacrificial substrate 102S, including the substrate portions between the wires 124. See FIG. 14A, showing the structure at the stage of FIG. 6E (after plating of metal 144). Then die can be placed on substrate 102S (as in FIG. 6G for example), except that there are no contact pads 118; the bottom die 112.1 can be simply attached to metal 144, with adhesive for example. See FIG. 14B. The fabrication proceeds as for the embodiments described above, but when the substrate 102S is thinned the entire substrate is removed. Also removed are the conductive layers between the wires 124, i.e. the barrier and seed layers (such as 106, if any) and metal 144. This can be done by a blanket process. Alternatively, parts of metal 144 and/or other conductive layers can be left between the wires to provide interconnects (similar to 116L in FIG. 3, not shown in FIG. 13). This can be achieved by masking the structure on the bottom after removal of substrate 102S (and possibly the removal of some of the conductive materials), and patterning the metal 144 on the bottom to provide the interconnects. This is not shown in FIG. 13. See FIG. 14C, showing the structure after the substrate removal. The whole structure is held together by the encapsulant 128. Wires 112 are exposed on the bottom.

If desired, contact pads 118 can be formed on the bottom (see FIG. 13), from a patterned metal layer for example. And/or some of encapsulant 128 can be removed from the bottom (by wet or dry blasting for example) to cause the wires 124 and/or contacts 112C of die 112.1 to protrude out. Other circuits can be attached to wires 124 and contact pads 112C of die 112.1 (in the example of FIG. 13, the wires 124 and contact pads 112C of die 112.1 are attached to contact pads 112C of die 112.5, 112.6, 112.7).

In other embodiments, after the stage of FIG. 14C, a circuit layer such as 104.T or 104.B (not shown) can be formed on the bottom of the structure, having contact pads 118 on top that are attached to wires 124 and/or contact pads 112C of die 112.1, and having bottom contact pads 120 which are subsequently attached to other circuits, such as die 112.5 for example.

In some embodiments, the polymer cores 130 are conductive, and a conductive coating 144 is omitted. The same fabrication processes can be used as described above, except that the steps related to fabrication of coatings 144 are omitted.

In certain embodiments, a polymer wire 124 supports multiple conductive lines 132, possibly insulated from each other. See for example FIG. 15, similar to FIG. 3 but with a discontinuous conductive coating 132 in each polymer wire 124: coating 132 does not surround core 130 (as shown in the top view in insert A), but provides two wires (two conductive lines) on opposite sides of core 130; each of the two wires 132 connects a separate contact pad 118 to a respective separate contact pad 112C of die 112.3 or 112.4.

Figure 15:
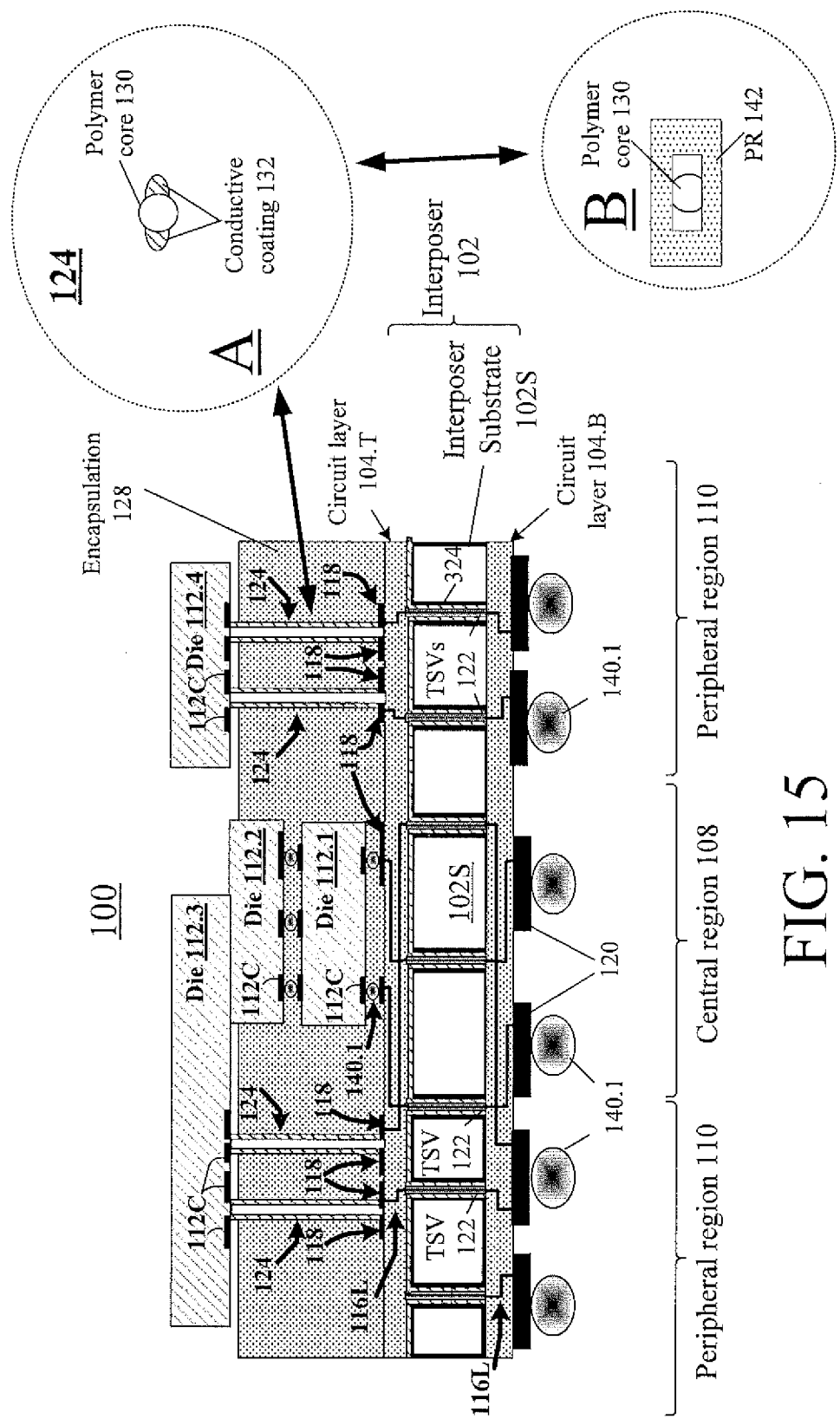
FIG. 15 is a vertical cross-sectional view of a microelectronic assembly with polymer wires having a discontinuous conductive coating according to some embodiments of the present disclosure.

Such structures can be manufactured by processes described above if they are modified to pattern the conductive coating 132 as desired. For example, at the step of FIG. 6D or 8A or 9A, the photoresist 142 can be patterned to shape the conductive coating 132 as in FIG. 15; insert B in FIG. 15 shows a horizontal cross section of an exemplary photoresist profile adjacent to a single core 130. In some embodiments, the photoresist covers the polymer core 130 on top; in other embodiments, the resist does not cover the polymer core, and the conductive coating 132 is initially plated on top of the polymer core but is later removed from the top by a suitable etch, CMP, or some other process.

Figure 16B:
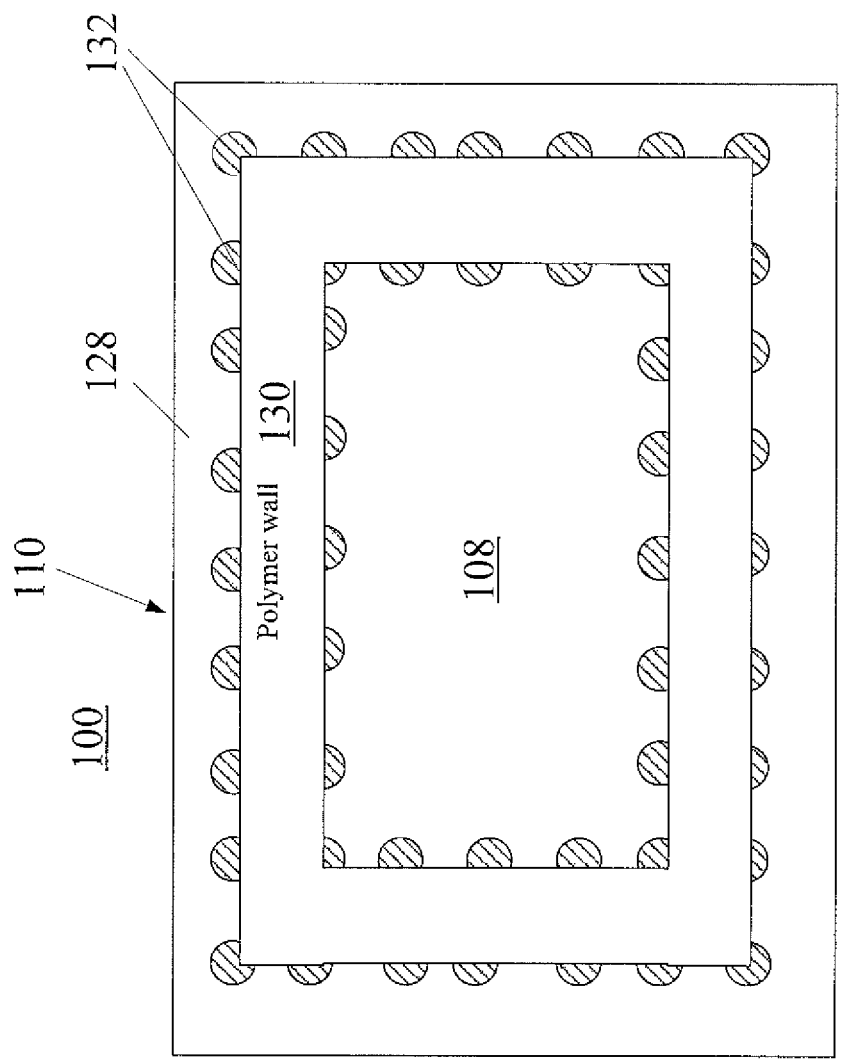

FIG. 16A is a top view of an exemplary array of wires 124 having a discontinuous conductive coating 132. The polymer wires 124 can be placed closer together without shorting the conductive traces (wires) 132 to each other. In fact, in some embodiments, polymer cores 130 touch each other. In FIG. 16B (top view of an exemplary array of wires 124), the polymer cores 130 merge into a single polymer wall with conductive traces 132 on both sides of the wall. In some embodiments, the polymer wall provides a stronger support structure than individual polymer wires.

Figure 17A:
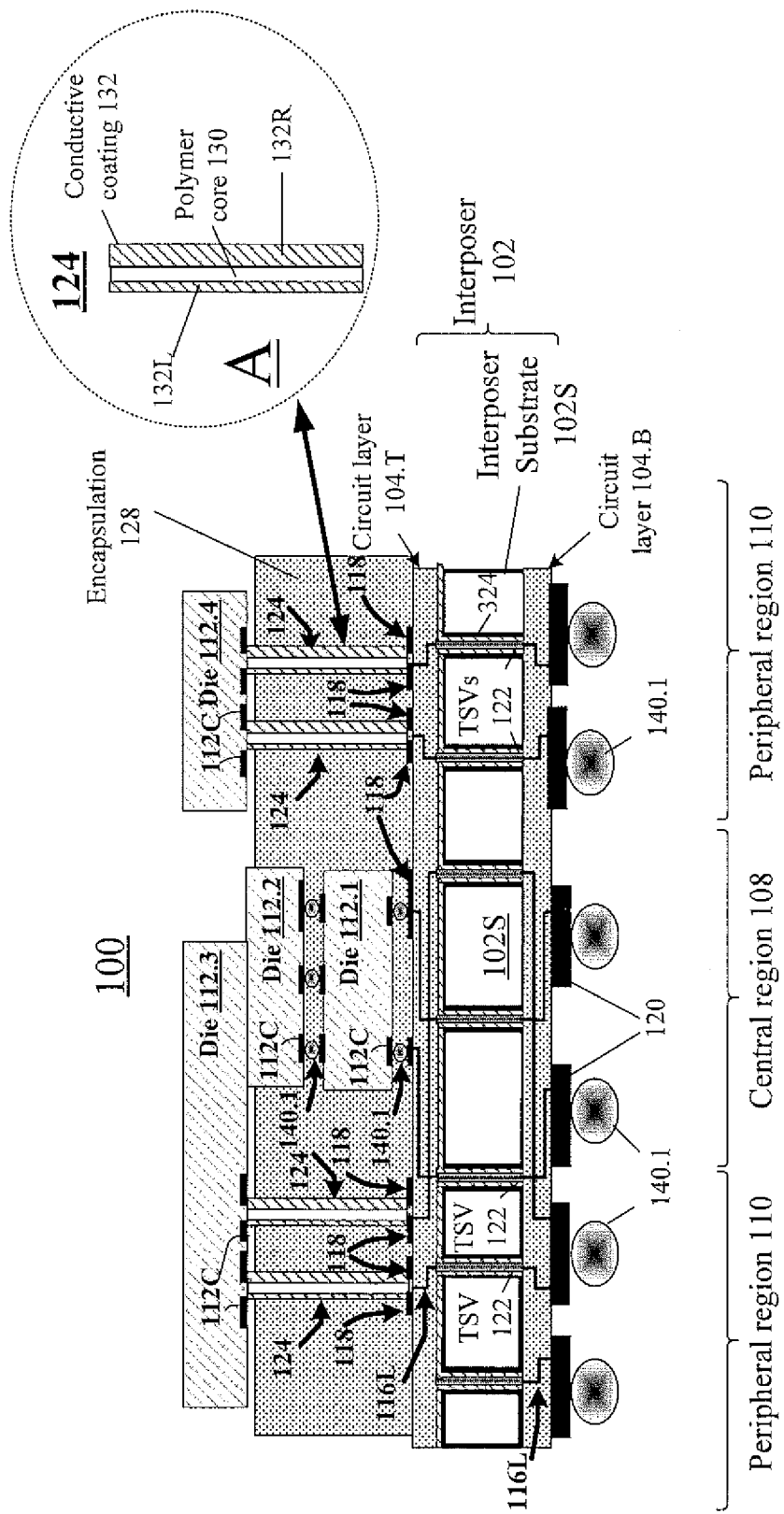
FIG. 17A is a vertical cross-sectional view of a microelectronic assembly with polymer wires having a discontinuous metal coating according to some embodiments of the present disclosure.

FIG. 17A illustrates a similar embodiment, but with the conductive wires 132 being of different thickness on different sides of the same polymer core 130: the conductive coating 132L on the left surface of the core 130 is thinner than conductive coating 132R on the right surface of the core 130. This may be desirable based on the kind of signals carried by the two wires: for example, one of the signals may require a lower resistance than the other signal for example. In another example, the thicker wire 132R carries a power supply voltage or ground voltage or some other constant voltage, and the thinner wire 132L carries an AC signal.

Each core 130 may support any number of wires 132. In some applications the core 130 may include three wires, one wire may be adapted or configured for power, the second wire for ground and the third one may be neutral. In some implementations, the core 130 may include four or more wires. For example, in the case of a polymer core 130 with four wires, one wire may be adapted or configured for power, another for ground and the other two wires for signals. In another example, one wire may be configured to transmit power, the second wire for ground, the third wire for signals, and the fourth wire is neutral. One of the advantages of parallel conductive buses 132 on the polymer core 130 is the reduction in signal skew. For example, when the conductors' 132 path lengths are not precisely matched, the resulting skew may lead to higher insertion loss, impedance mismatch, and/or crosstalk amongst each other.

Figures 17B, 18:
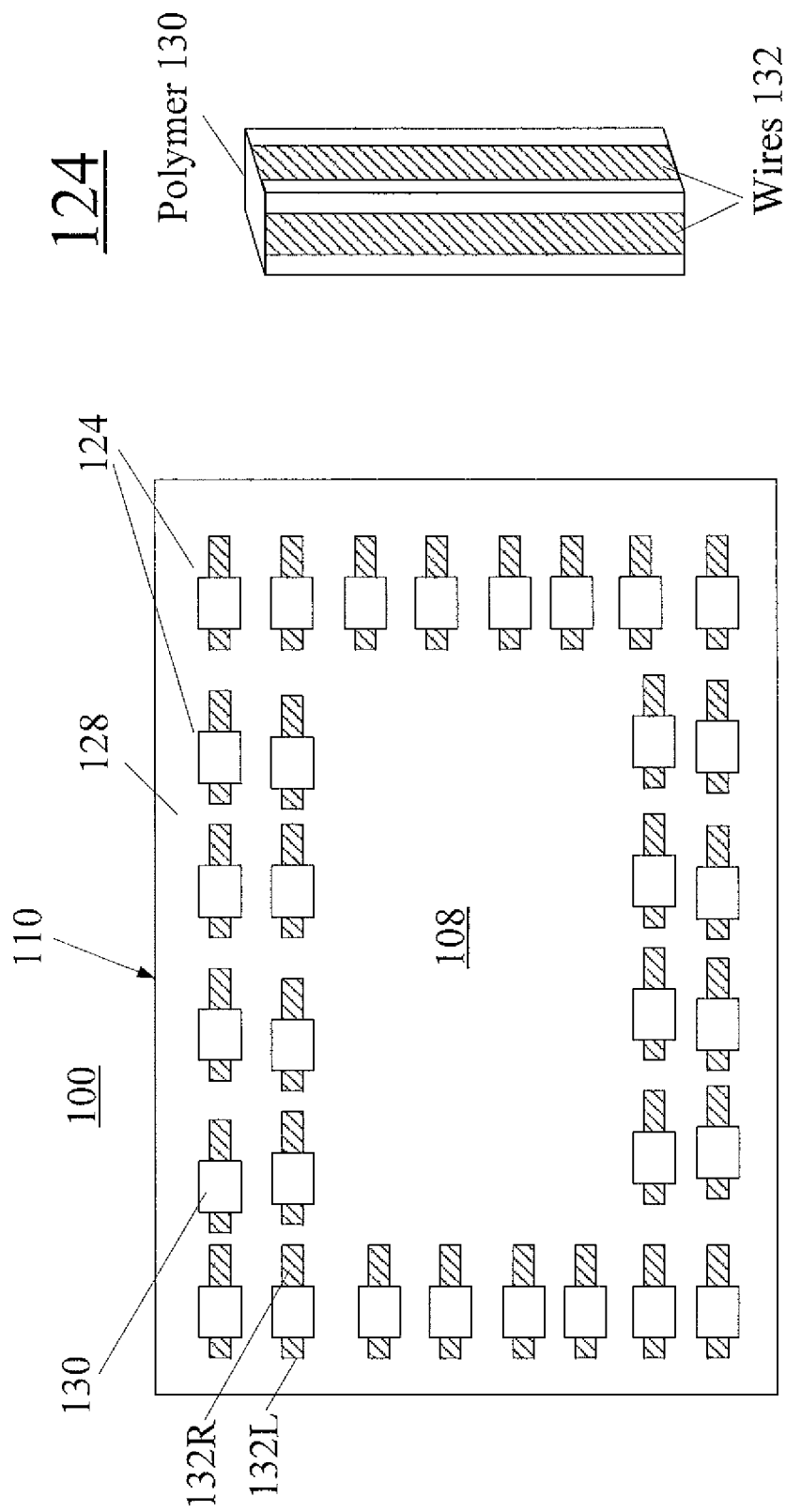
FIG. 17B is a plan view of a microelectronic assembly with polymer wires having a discontinuous metal coating according to some embodiments of the present disclosure.
FIG. 18 is a perspective view of parallelepiped core of a polymer wire according to some embodiments of the present disclosure.

FIG. 17B shows a top view of an exemplary array of polymer wires 124 having conductive coatings of different thicknesses 132L and 132R.

Of note, the cores 130 can be of any shape, including conic. In other embodiments, the sides are vertical (see FIG. 17A for example). In FIGS. 17A and 17B, the cores are rectanguloid, i.e. in the top view of FIG. 17B the cores are rectangular, and other polygon and non-polygon shapes are also possible. Also, the cores' sides do not have to be vertical (e.g. polygon but not orthogonal polygon shapes are possible). The polygon shapes may include any number of sides (greater than 2 of course). The side and top surfaces of core 130 may include linear or non-linear (e.g. curvilinear) features. FIG. 18 shows a perspective view of one parallelepiped core 130 in which two adjacent sides each support one wire 132. In other embodiments, the wires 132 are provided on all the sides, or any number of sides, of a polygonal core 130. If desired, wires 132 may be shorted to each other (e.g. by a strip of layer 132 on top of core 130). Alternatively, wires 132 may be electrically insulated from each other.

Figure 19A:
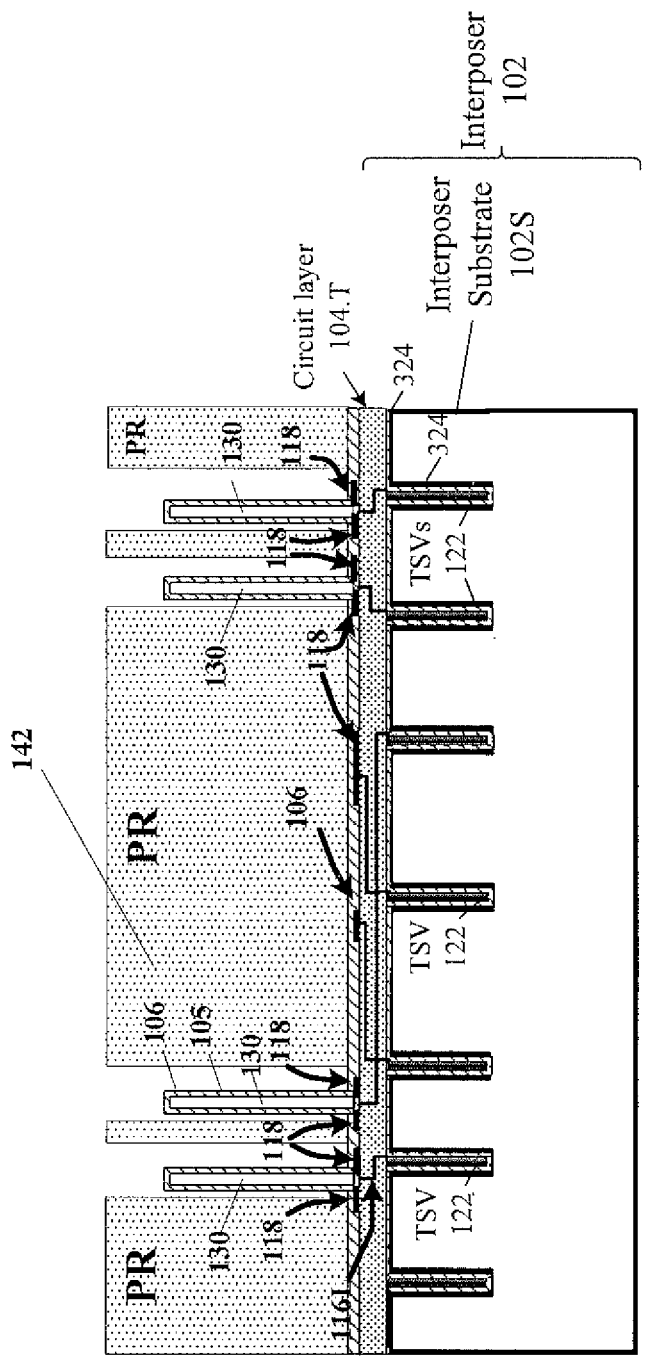
FIGS. 19A-19C are vertical cross-sectional views of a microelectronic assembly with polymer wires having a discontinuous metal coating at different stages of fabrication according to some embodiments of the present disclosure.
Figure 19B:
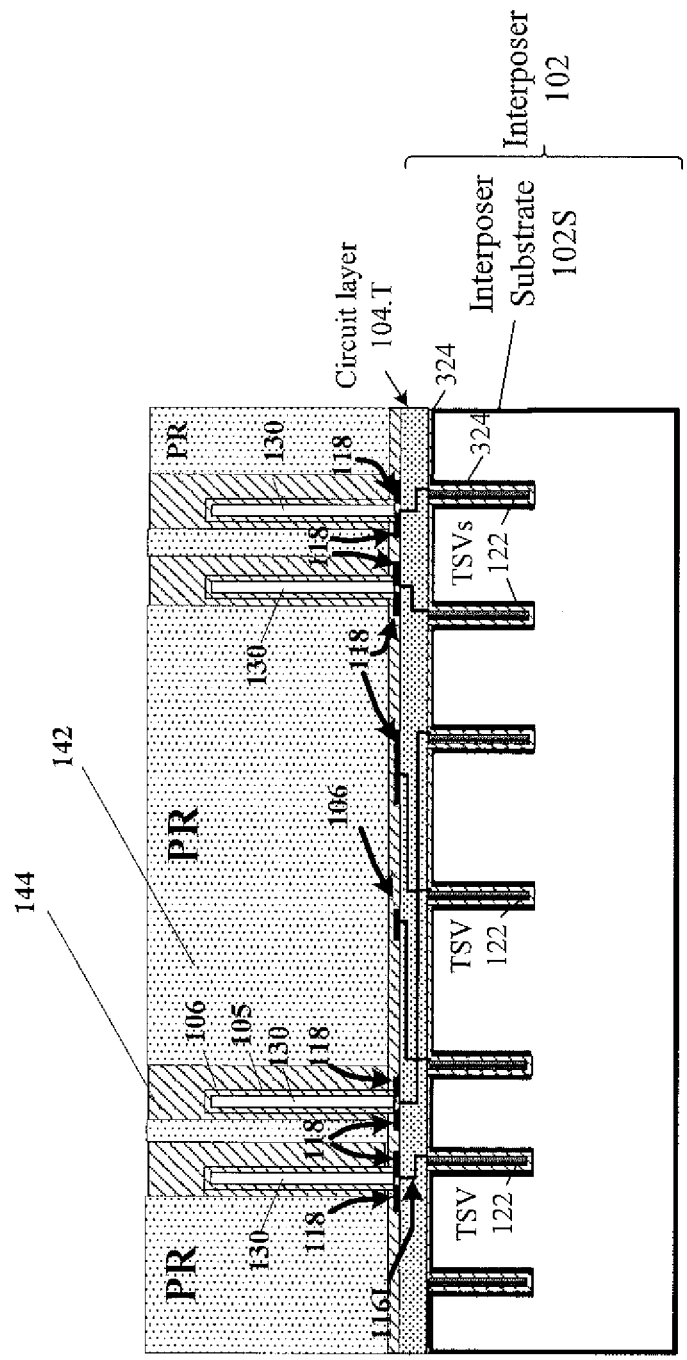
Figure 19C:
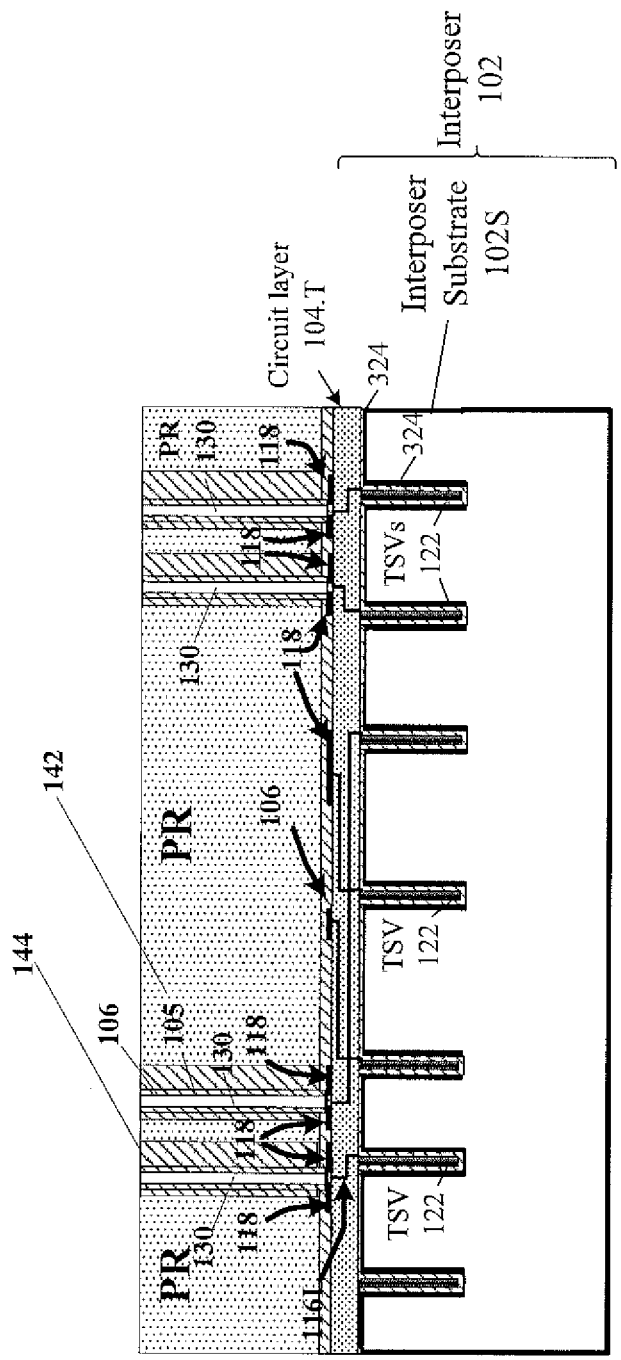

FIGS. 19A-19C show the fabrication steps involved in forming polymer wires 124 having conductive coatings with different thicknesses. FIG. 19A shows the structure at the stage of FIG. 6D (after forming the patterned photoresist 142 on the substrate 102 and in between the polymer cores 130). The PR 142 is patterned so that the lateral distance between the core 130 and the PR 142 is larger on one side of the core 130 than the other side. Turning now to FIG. 19B, metal 144 is plated on the seed layer 106. Because of the increased space between the core and PR 142 on one side, more metal is deposited, resulting in a greater thickness. FIG. 19C shows that CMP is performed to remove the top portions of the seed layer 106 and the metal 144 to expose the core 130. The steps described in FIGS. 6F-6J may then be performed. Fabrication may also be performed as in other processes described above.

Figure 20:
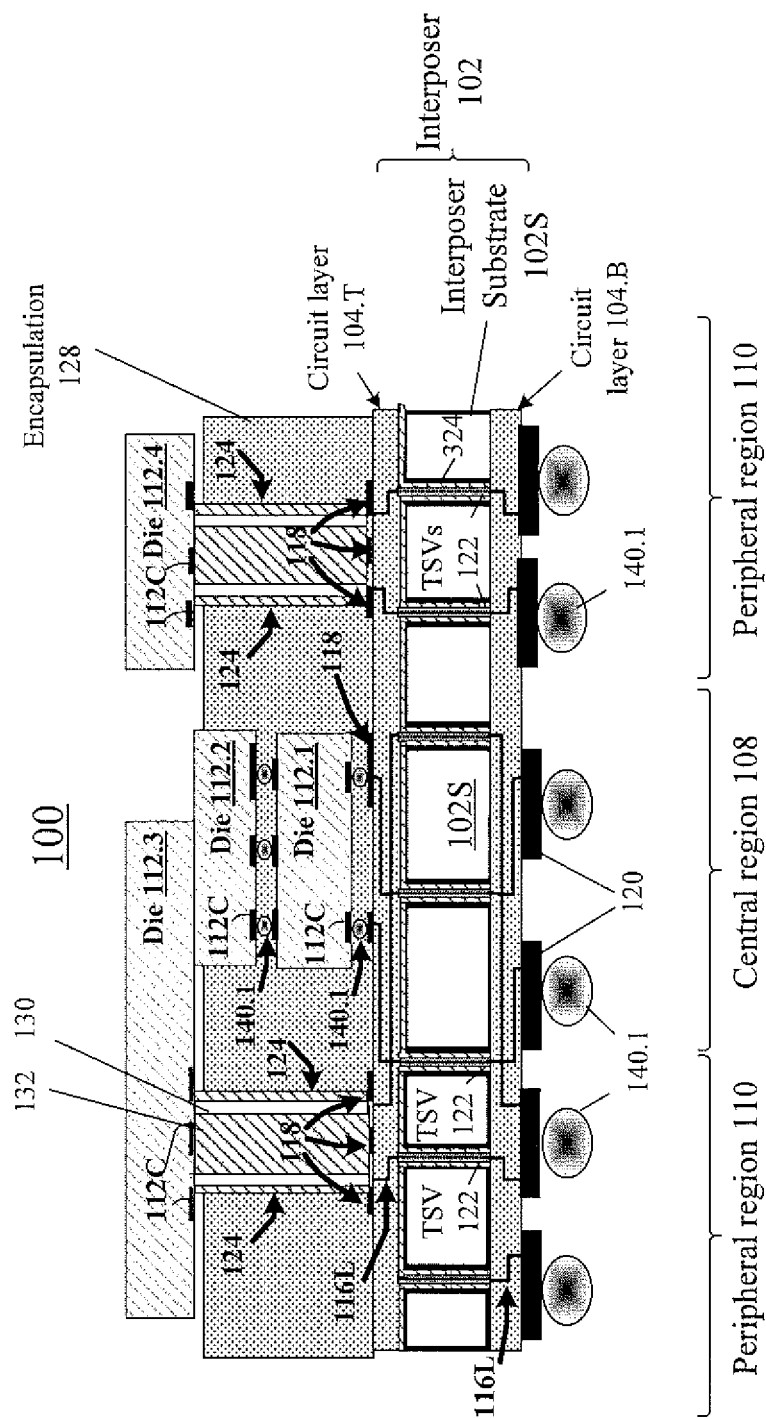
FIG. 20 is a vertical cross-sectional view of a microelectronic assembly with polymer wires having a discontinuous metal coating according to some embodiments of the present disclosure.
Figure 21:
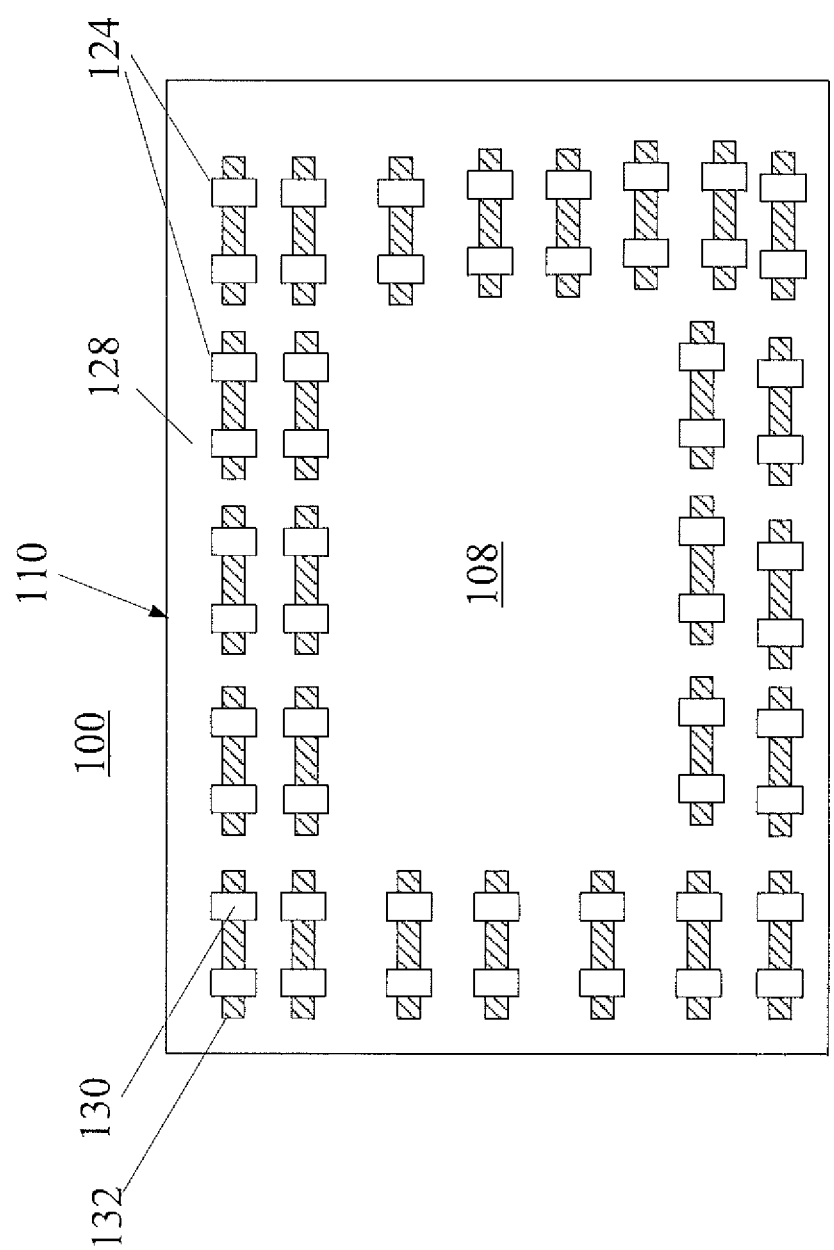
FIG. 21 is a plan view of a microelectronic assembly with polymer wires having a discontinuous metal coating according to some embodiments of the present disclosure.

In the example of FIG. 20, two polymer cores 130 share a single wire 132 supported by both cores 130 on its opposite sides. (FIG. 20 is similar to FIG. 3 except for the configuration of the polymer wires 124 and the contact pads interconnected by the wires). In this embodiment, there are three conductive features or lines 132 that connect to the polymer wire 124. This structure can be made by the steps of FIGS. 19A-19C, except that the PR 142 is patterned not to be present between the cores 130; the distances between the cores 130 and the PR 142 are as needed to provide proper thickness for coating 132. As shown, three contact pads 112C of die 112.3 and three contact pads 112C of die 112.4 contact polymer wire 124. FIG. 21 shows a top view of an exemplary array of polymer wires 124 having multiple conductive features 132 as in FIG. 20. The polymer cores 130 in this embodiment are polygon shaped.

Figure 22:
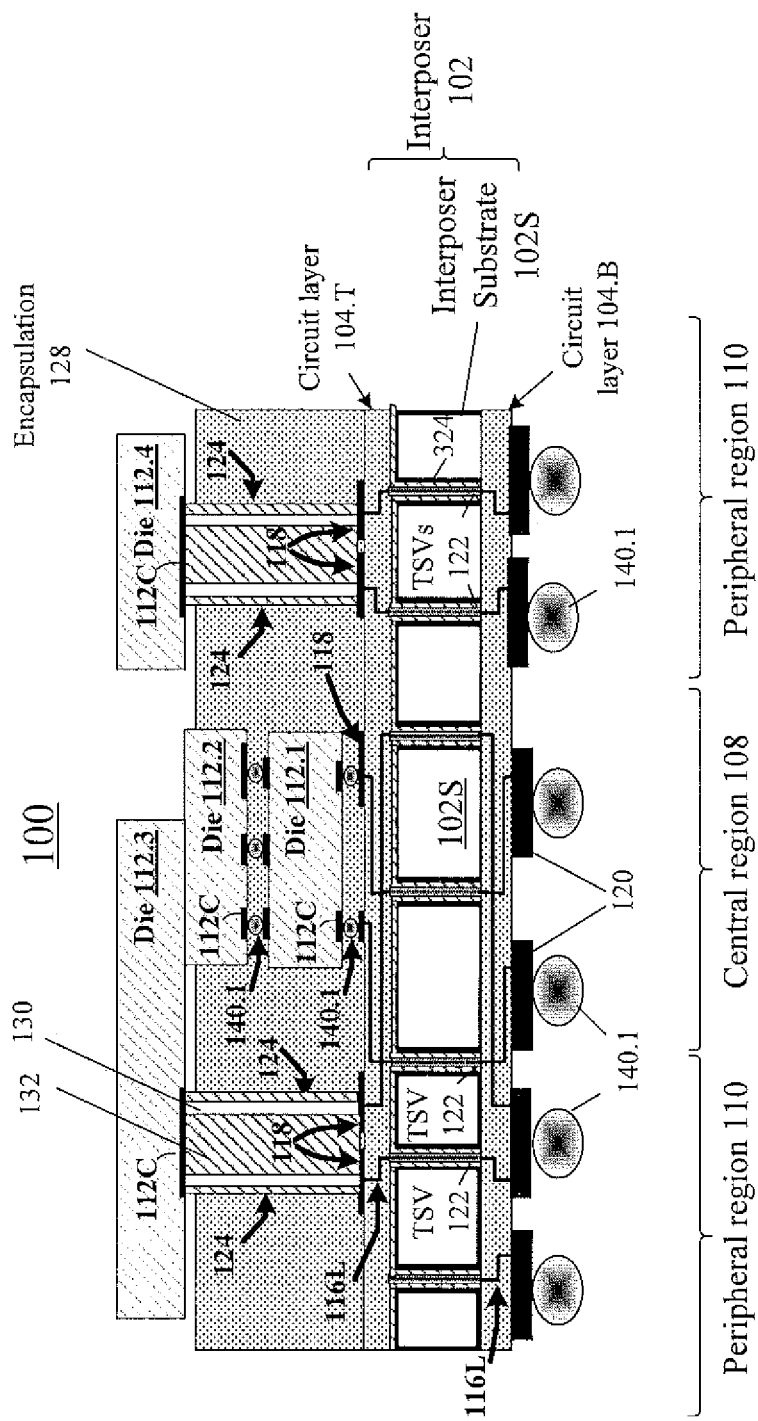
FIG. 22 is a vertical cross-sectional view of a microelectronic assembly with polymer wires having a discontinuous metal coating according to some embodiments of the present disclosure.

FIG. 22 shows the same structure as FIG. 20, except the three conductive features 132 supported by two adjacent cores 130 are connected to, and shorted by, a single pad 112C of die 112.3 or 112.4 to provide for redundant wiring structures. In addition, there are two respective pads 118 connected to the three wires; each pad 118 connects the center wire to one of the side wires 132. Any other suitable distribution and interconnection between the wires 132 and the contact pads 112C and 118 is possible.

Figure 23:
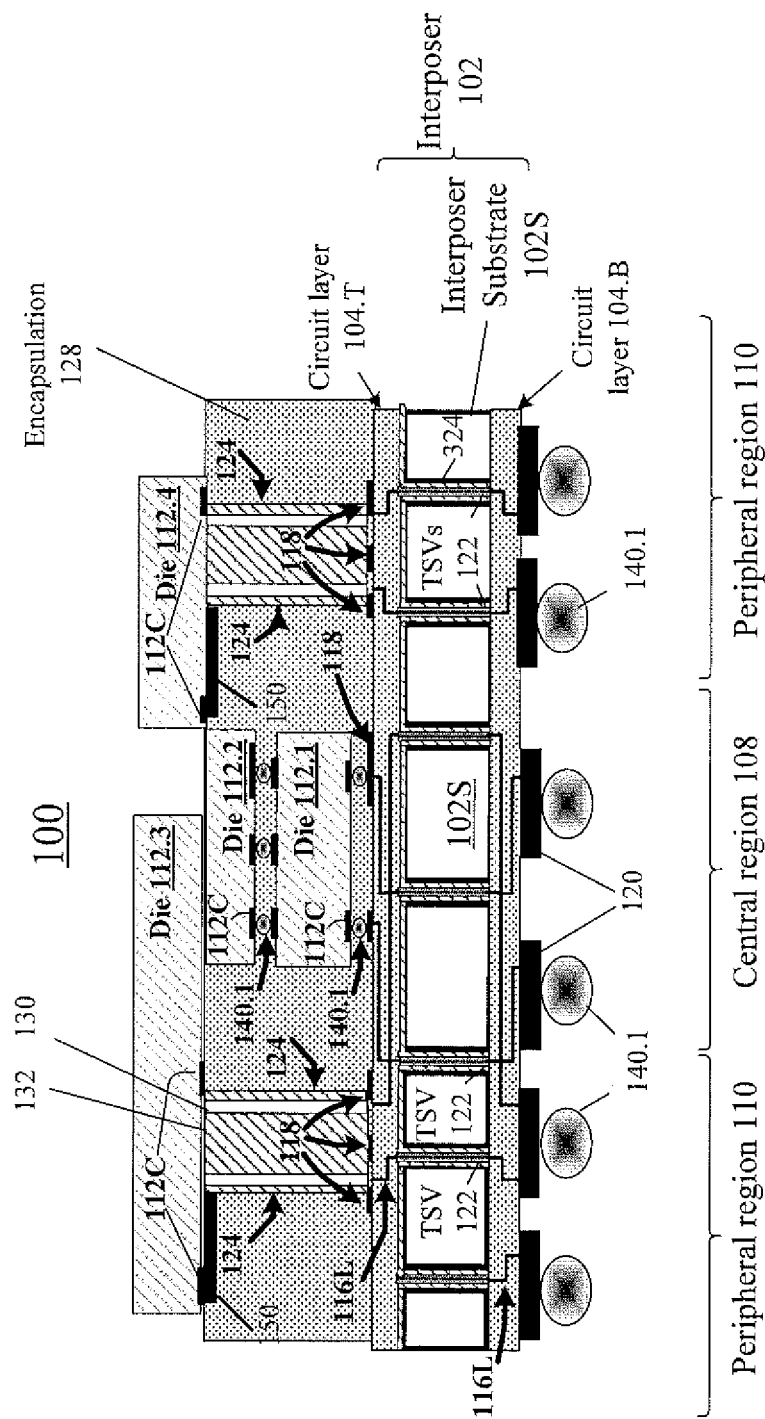
FIG. 23 is a vertical cross-sectional view of a microelectronic assembly with polymer wires having a discontinuous metal coating according to some embodiments of the present disclosure.

FIG. 23 shows the same structure as FIG. 20, except for conductive traces 150 which connect selected conductive wires 132 to other features (e.g. pads 112C) over encapsulant 128. For example, a copper trace 150 may be formed by a damascene process (etching trenches in encapsulant 128, covering the encapsulant 128 with copper, and then removing copper by CMP or some other process from the top of the encapsulant and polymer 130 to leave the copper only in the trenches); other materials and processes can also be used.

Advantageously, in some embodiments, the polymer wires described in the present disclosure are less expensive than wire bonds. Instead of being formed entirely from metal, in some embodiments, the polymer wires include a polymer core coated with a metal layer. Moreover, the polymer wires can be made simultaneously, rather than one at a time, which reduces costs. In addition, the polymer wires can be spaced closer together than wire bonds to provide high density.

Figure 24:
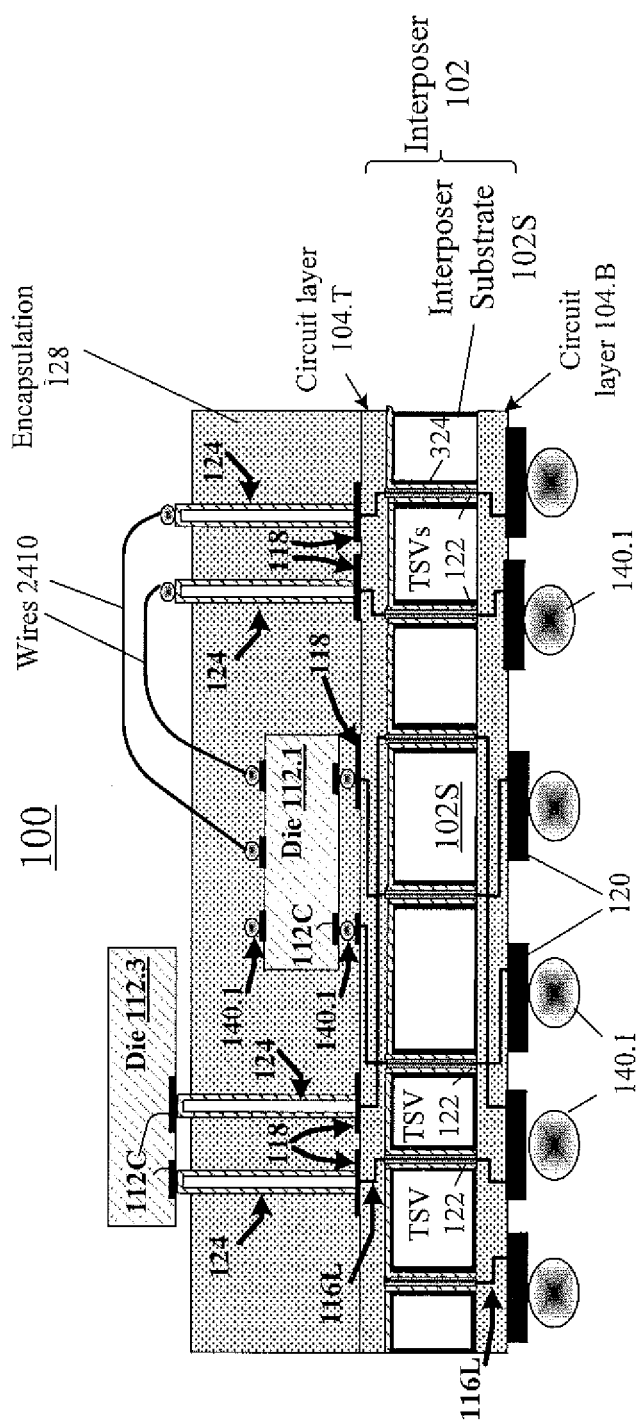
FIG. 24 is a vertical cross-sectional view of a microelectronic assembly that includes a substrate with polymer wires according to some embodiments of the present disclosure.

Some embodiments of the invention can be defined by the following clauses:

Clause 1 defines a first structure comprising:
a substrate; and
a first microelectronic component disposed in a first region of the substrate. In some embodiments, the first region corresponds to a region with no polymer wires, e.g. the region occupied by die 112.1 and 112.2. The die may or may not be connected to polymer wires; see e.g. FIG. 24, showing a structure similar to FIG. 3, with a die 112.1 in the region without polymer wires; the die is connected to polymer wires 124 by wires 2410 (possibly metal wires).

In alternate embodiments, a circuit layer similar to 104.T can be formed on top of the encapsulant 128 and die 112.1 to connect the die 112.1 to polymer wires 124. These examples are not limiting.

Further according to clause 1, the first structure also includes one or more first members disposed in a second region of the substrate. Each first member includes one or more polymers and one or more conductive lines.

Further according to clause 1, the first structure also includes one or more contact pads on a surface of at least one conductive line. The one or more contact pads connect the one or more first members to a second microelectronic component.

Clause 2 defines the first structure of clause 1, wherein the first member comprises a dielectric.

Clause 3 defines the first structure of clause 1, wherein each conductive line is formed on a surface of at least one first member.

Clause 4 defines the structure of clause 1, wherein the first region comprises one or more second contact pads (e.g., 118).

Clause 5 defines the first structure of clause 1, wherein at least two conductive lines are formed on a surface of a single member and are spaced from each other.

Clause 6 defines the first structure of claim 5, wherein the at least two conductive lines are electrically isolated from one another.

Clause 7 defines the first structure of clause 6, wherein at least one of the at least two conductive lines is coupled to a power source, data signal or ground and at least one other of the at least two conductive lines is coupled to a different power source, data signal, or ground.

Clause 8 defines the first structure of clause 1, wherein at least one conductive line physically contacts at least two first members.

Clause 9 defines the first structure of claim 1, wherein the one or more polymers comprise a plastic or a photosensitive material.

Clause 10 defines the first structure of clause 1, further comprising a continuous dielectric layer (e.g., 128) that encapsulates each conductive line along at least part of a length of each conductive line.

Clause 11 defines the first structure of clause 1, wherein at least one conductive line provides at least part of a conductive path interconnecting at least two microelectronic components, at least two circuit components, or a combination of circuit components and microelectronic components.

Clause 12 defines a microelectronic assembly comprising:
a substrate (e.g., 102);
one or more first members (e.g., core 130), each first member comprising one or more polymers;
one or more conductive lines (e.g., 132), wherein each conductive line is part of at least one first member and/or is formed on a surface of at least one first member; and
a continuous dielectric layer (e.g., 128) that encapsulates each conductive line along at least part of a length of each conductive line,
wherein the one or more conductive lines protrude out of the continuous dielectric layer.

Clause 13 defines a method for fabricating a first structure, wherein the method comprises:
obtaining a substrate (e.g., 102);
placing one or more microelectronic components (e.g., dies 112.1 and 112.2) in a first region of the substrate;
placing one or more first members in a second region of the substrate, wherein each first member comprises one or more polymers and one or more conductive lines; and
coupling one or more contact pads to a surface of at least one conductive line, wherein the one or more contact pads connect the one or more first members to a second microelectronic component.

Clause 14 defines the method of clause 13, wherein at least two conductive lines are formed on a surface of a single member and are spaced from each other.

Clause 15 defines the method of clause 13, wherein the one or more first members are a plurality of first members and are formed simultaneously.

Clause 16 defines the method of clause 13, wherein forming the one or more conductive lines comprises forming a conductive coating over each first member along an entire length of each first member.

Clause 17 defines the method of clause 16, wherein forming the conductive coating comprises:
forming a masking layer over the substrate, the masking layer being spaced from each first member;
forming a plating seed layer over or under the masking layer, the plating seed layer coating each first member;
plating a conductive material on the seed layer.

Clause 18 defines the method of clause 17, wherein the seed layer is electrically conductive, the one or more first members are a plurality of first members, and the method further comprises removing a portion of the seed layer around each first member to prevent the seed layer from shorting the first members to each other.

Clause 19 defines the method of clause 13, further comprising, after forming the one or more conductive lines, removing the substrate to expose an end of each conductive line.

Clause 20 defines the method of clause 19, further comprising, before removing the substrate, forming a continuous dielectric layer that encapsulates each conductive line along at least part of a length of each conductive line, wherein the one or more conductive lines are a plurality of conductive lines.

Clause 21 defines a structure comprising one or more electrically conductive interconnects, each interconnect comprising a polymer member extending along the interconnect, each interconnect comprising at least two electrically conductive areas each of which is attachable to circuitry.

Clause 22 defines the structure of clause 21, wherein the polymer member includes a first end, a second end, and an edge extending from the first end to the second end. The polymer member has a length greater than its width and the electrically conductive area extends from the first end to the second end along the edge.

Clause 23 defines the structure of clause 21, wherein at least one electrically conductive area of at least one interconnect is attached to a contact pad of an integrated circuit or a semiconductor integrated circuit or an interconnect substrate.

Clause 24 defines the structure of claim 21, wherein at least one interconnect comprises an electrically conductive coating which coats the polymer member and has a higher conductivity than the polymer member.

Clause 25 defines the structure of claim 23, wherein the electrically conductive coating comprises one or more of metal, doped polysilicon, or carbon.

Clause 26 defines the structure of claim 23, wherein the polymer member comprises a plastic or a photosensitive material.

Clause 27 defines the structure of claim 21, wherein at least one interconnect of the polymer member is electrically conductive.

Clause 28 defines the structure of claim 21, comprising a plurality of said interconnects and further comprising a continuous dielectric layer that encapsulates each interconnect along at least part of a length of each interconnect.

Clause 29 defines the structure of claim 21, comprising a plurality of said interconnects disposed on a dielectric layer and wherein at least one interconnect transmits power, ground, data and neutral signals.

The invention is not limited to the examples above. Other embodiments and variations are within the scope of the invention, as defined by the appended claims.

The invention claimed is:

1. A fabrication method comprising:
providing a substrate;
forming one or more support members on the substrate, each support member being for supporting one or more electrically conductive wires, each support member comprising one or more polymers;
forming a first layer over the substrate, the first layer laterally surrounding each support member, at least a part of a sidewall surface of each support member being spaced from a sidewall surface of the first layer to form a gap laterally bounded by the sidewall surface of the support member and the sidewall surface of the first layer;
forming the one or more wires, wherein at least a portion of each wire extends on the sidewall surface of at least one support member in the corresponding gap laterally bounded by the sidewall surfaces of the support member and the first layer, each wire having a top surface comprising solder, wherein forming the one or more wires comprises, after forming the first layer, plating a conductor comprising the solder while using the first layer as a mask, at least a portion of the conductor being plated into each said gap.

2. The method of claim 1 wherein forming the one or more wires comprises, before forming the first layer, forming a conductive layer on a sidewall of each support member, the conductive layer comprising a seed layer for at least part of said plating, each said gap comprising a space bounded by a corresponding sidewall surface of the seed layer and the corresponding sidewall surface of the first layer, said portion of the conductor being plated into each said space.

3. The method of claim 1 wherein in each wire, the plated conductor extends from the substrate to a top of the corresponding support member.

4. The method of claim 1 wherein the first layer is formed such that a top surface of each support member is below a top of an adjacent sidewall surface of the first layer at the corresponding gap laterally bounded by the support member's and the first layer's sidewall surfaces.

5. The method of claim 4 wherein said plating the conductor comprises:
plating a first conductor into each said gap with the first layer acting as a mask, wherein a top surface of the first conductor is below the top surface of the first layer; and
plating a second conductor over the first conductor with the first layer acting as a mask, the second conductor being electrically connected to the first conductor and having a top surface comprising said solder.

6. The method of claim 5 wherein during said plating of the second conductor, the first layer physically contacts the sidewall of the first conductor to prevent solder formation below the second conductor.

7. The method of claim 5 wherein:
the first conductor comprises a layer of copper;
the second conductor comprises a layer of nickel formed after the layer of copper, and a layer of solder formed after the layer of nickel.

8. The method of claim 1 further comprising reflowing the solder of at least one said wire to connect the wire to at least one of: (i) an integrated circuit, (ii) an assembly comprising an integrated circuit, (iii) an integrated circuit packaging substrate.

9. The method of claim 1 further comprising removing the first layer and then reflowing the solder, wherein in each wire, the solder overlies a conductive layer which is more wettable by the solder than the wire surface underlying the conductive layer, a greater wettability of the conductive layer serving to impede the solder from reaching the wire surface underlying the conductive layer during the solder reflow.

10. A fabrication method comprising:
providing a substrate;
forming one or more support members on the substrate, each support member being for supporting one or more electrically conductive wires, each support member comprising one or more polymers;
forming a first layer over the substrate, the first layer laterally surrounding each support member;
forming the one or more wires, wherein at least a portion of each wire extends on a sidewall surface of at least one support member in a gap between the support member and the first layer, each wire having a top surface comprising solder, wherein forming the one or more wires comprises, after forming the first layer, plating a conductor comprising the solder while using the first layer as a mask, at least a portion of the conductor being plated into the gap;
wherein each support member is dielectric.

11. A fabrication method comprising:
providing a substrate;
forming one or more support members on the substrate, each support member being for supporting one or more electrically conductive wires, each support member comprising one or more polymers;

forming a first layer over the substrate, the first layer laterally surrounding each support member;

forming the one or more wires, wherein at least a portion of each wire extends on a sidewall surface of at least one support member in a gap between the support member and the first layer, each wire having a top surface comprising solder, wherein forming the one or more wires comprises, after forming the first layer, plating a conductor comprising the solder while using the first layer as a mask, at least a portion of the conductor being plated into the gap;

removing the entire first layer after plating the conductor.

12. A fabrication method comprising:

providing a substrate;

forming one or more support members on the substrate, each support member being for supporting one or more electrically conductive wires, each support member comprising one or more polymers;

forming a first layer over the substrate, the first layer laterally surrounding each support member;

forming the one or more wires, wherein at least a portion of each wire extends on a sidewall surface of at least one support member in a gap between the support member and the first layer, each wire having a top surface comprising solder, wherein forming the one or more wires comprises, after forming the first layer, plating a conductor comprising the solder while using the first layer as a mask, at least a portion of the conductor being plated into the gap;

wherein for at least one support member, for at least two wires, each wire has at least a portion extending on the sidewall surface of the support member.

13. A fabrication method comprising:

providing a substrate;

forming one or more support members on the substrate, each support member being for supporting one or more electrically conductive wires, each support member comprising one or more polymers;

forming the one or more electrically conductive wires, wherein at least a portion of each wire extends on a sidewall surface of at least one support member, each wire having a top surface comprising solder;

after forming the one or more wires, forming a dielectric layer which laterally surrounds at least a length of each said at least a portion of each wire but exposes at least one conductive region of each wire; and after forming the dielectric layer, mounting one or more first microelectronic components above the dielectric layer, each first microelectronic component being at least one of (i) an integrated circuit, (ii) an assembly comprising an integrated circuit, (iii) an integrated circuit packaging substrate; and attaching one or more contact pads of each first microelectronic component to said one or more conductive regions;

wherein for at least one support member, for at least two wires, each wire has at least a portion extending on the sidewall surface of the support member.

14. The method of claim 13 further comprising, before forming the dielectric layer, attaching one or more second microelectronic components to the substrate, wherein each second microelectronic component is at least one of (i) an integrated circuit, (ii) an assembly comprising an integrated circuit, (iii) an integrated circuit packaging substrate;

wherein at least one first microelectronic component has a portion overlying at least one second microelectronic component.

15. The method of claim 14 wherein at least one second microelectronic component is not covered by the dielectric layer.

16. The method of claim 14 wherein at least one second microelectronic component has a top surface which is at least as high as a top of the dielectric layer.

17. The method of claim 13 wherein forming the dielectric layer comprises:

forming the dielectric layer to cover each interconnect structure; and then thinning the dielectric layer from a top of the dielectric layer to expose each said conductive region;

wherein said thinning comprises chemical mechanical polishing of a top surface of the dielectric layer.

18. The method of claim 1, further comprising:

removing at least part of the first layer around one or more of the support members and the wires; and then forming an encapsulant encapsulating the support members and the wires.

19. The method of claim 1, further comprising:

removing the entire first layer after forming the wires; and then forming an encapsulant encapsulating the support members and the wires.

* * * * *